United States Patent [19]

Sakuma et al.

[11] Patent Number: 5,606,181
[45] Date of Patent: Feb. 25, 1997

[54] EDGE EMITTING TYPE LIGHT EMITTING DIODE ARRAY HEADS

[75] Inventors: Nobuo Sakuma, Tokyo; Seizo Suzuki; Hiromichi Atsuumi, both of Yokohama; Takeshi Ueda; Yasutaka Izumi, both of Tokyo, all of Japan

[73] Assignee: Ricoh Company, Ltd., Tokyo, Japan

[21] Appl. No.: 413,094

[22] Filed: Mar. 29, 1995

[30] Foreign Application Priority Data

Mar. 29, 1994 [JP] Japan .................................. 6-059236
Jul. 11, 1994 [JP] Japan .................................. 6-158931
Sep. 20, 1994 [JP] Japan .................................. 6-223852

[51] Int. Cl.$^6$ .................................................. H01L 33/00
[52] U.S. Cl. .......................... 257/88; 257/79; 257/80; 257/81; 257/91; 257/95; 257/98
[58] Field of Search ............................. 257/79, 80, 81, 257/82, 83, 88, 91, 95, 96, 98

[56] References Cited

U.S. PATENT DOCUMENTS 5,498,883   3/1996   Lebby et al. .......................... 257/95

FOREIGN PATENT DOCUMENTS

| 60-32373 | 2/1985 | Japan . |
| 60-90782 | 5/1985 | Japan . |
| 60-90783 | 5/1985 | Japan . |
| 60-90784 | 5/1985 | Japan . |
| 60-99672 | 6/1985 | Japan . |
| 60-99673 | 6/1985 | Japan . |
| 60-116479 | 6/1985 | Japan . |

*Primary Examiner*—Carl Whitehead, Jr.
*Attorney, Agent, or Firm*—Woodcock Washburn Kurtz Mackiewicz & Norris

[57] ABSTRACT

An LED array head comprises a plurality of LED elements and a reflecting element, wherein the reflecting element directs luminous flux emitted from the LED element in a direction substantially perpendicular to the luminous flux emitting direction.

41 Claims, 19 Drawing Sheets

$$S = \frac{-n+2}{n(n-1)} r$$

$$S_1 = S_2' = \frac{r}{n-1}$$

$$S_1 = \frac{2r_{11}}{n_1} + \frac{r_{21}}{n_2 - 1}$$

$$S_2' = \frac{r_{21}}{n_2 - 1} - \frac{2r_{31}}{n_3 - 1}$$

EDGE EMITTING TYPE LIGHT EMITTING DIODE ARRAY HEADS

BACKGROUND OF THE INVENTION

1. Field of the Invention

This invention is generally related to light emitting diode (LED) array head for optical printers, digital copiers or facsimile machines, etc. and is particularly related to edge emitting type LED array heads.

2. Description of the Related Art

A light emitting diode (hereinafter referred to as an LED) array comprises a plurality of end surface emitting LED elements which are disposed in at least one row. Such an LED array is used in an optical printer, a digital copier or a facsimile as disclosed in Japanese Laid Open Patent Nos. 60-32373, 60-90782, 60-90783, 60-90784, 60-99672, 60-99673 and 60-116479.

The LED elements are more reliable for use under vibrations and noises than laser beam printers (LBP). They are also suitable for miniaturizing an optical head since an apparatus with an LED array head does not need a scanning mechanism such as a polygonal mirror as needed by LBP using a semiconductor laser.

On the other hand, the LED elements have at least the following problems. For example, the quantity of light from each element is dispersive, and beam spot shapes are not uniform. These problems generally originate from a unit magnification focusing element of a rod lens array or a gradient index lens etc. rather than the LED itself. In particular, these problems may be caused by the following two reasons: First, a dispersed light loss may occur at connecting portions between the rod lenses. This light loss occurs near the connecting portions due to a difference in a pitch of emitting elements and that of focusing elements. Secondly, it is difficult to uniformly converge light beams since flared light such as reflected light in a rod lens easily occurs.

LED arrays are generally classified into two types. The first type is an area or surface emitting type, and the second type is an edge emitting or end surface emitting type. The emitting type has the following three advantages: First, the edge emitting type is more suitable for an LED array of high density than the surface emitting type. Secondly, the coupling efficiency of a focusing element in the edge emitting type is higher than that of the surface emitting type since the directionality of the output light of the edge emitting type is more focused than that of the surface emitting type. In other words, a diffusion angle is relatively small in a sub-scanning direction. Thirdly, a high output is obtained by a low current.

On the other hand, the end surface emitting type has the following disadvantages: First, when a wire bonding mounting technique as used for an area emitting type LED is applied to the end surface emitting type LED, since the wire bonding has to be performed from an opposite side of the emitting end surface, the end surface emitting type may not be mounted at a high density. Secondly, when chips are cut out from a wafer as shown in FIG. 38, the emitting end of an LED element 4 and the wafer base plate 3 do not share the same plane. The height and width of the cut surface are respectively a few μm and 10 μm. Because of this cut surface, a part of luminous flux emitted from a side of an active layer 2 is reflected on the base plate 3 while other parts of the luminous flux are not reflected on the base plate 3. As a result, a pattern of light emission becomes uneven. Thirdly, when the end surface emitting LED's are combined with rod array, as already discussed above, a disposed light loss occurs at connecting portions between the rod lenses.

SUMMARY OF THE INVENTION

The present invention has an object to overcome the above and other problems encountered in the aforementioned art.

It is an object of the present invention to provide an LED array head having a uniform light emitting pattern.

It is a further object of the present invention to provide a high density LED array head.

The above-mentioned objects of the present invention are achieved by an LED array head having a reflecting element which directs each light flux from edge emitting type LED elements in a substantially vertical direction. Thus, the light flux from the LED element is reflected in a direction substantially perpendicular to the emitting direction by the reflecting element right after emission, whereby the reflected light hardly reaches a surface of a base plate. Therefore, an uneven light emitting pattern in the edge emitting LED array is substantially improved by eliminating reflected luminous flux from the base plate.

BRIEF DESCRIPTION OF THE DRAWINGS

Other objects and features of the present invention will become apparent from the following detailed description when read in conjunction with the accompanying drawings, wherein.

Description of the Preferred Embodiment

Following is a description of the preferred embodiments according to the present invention.

Figure 1A:
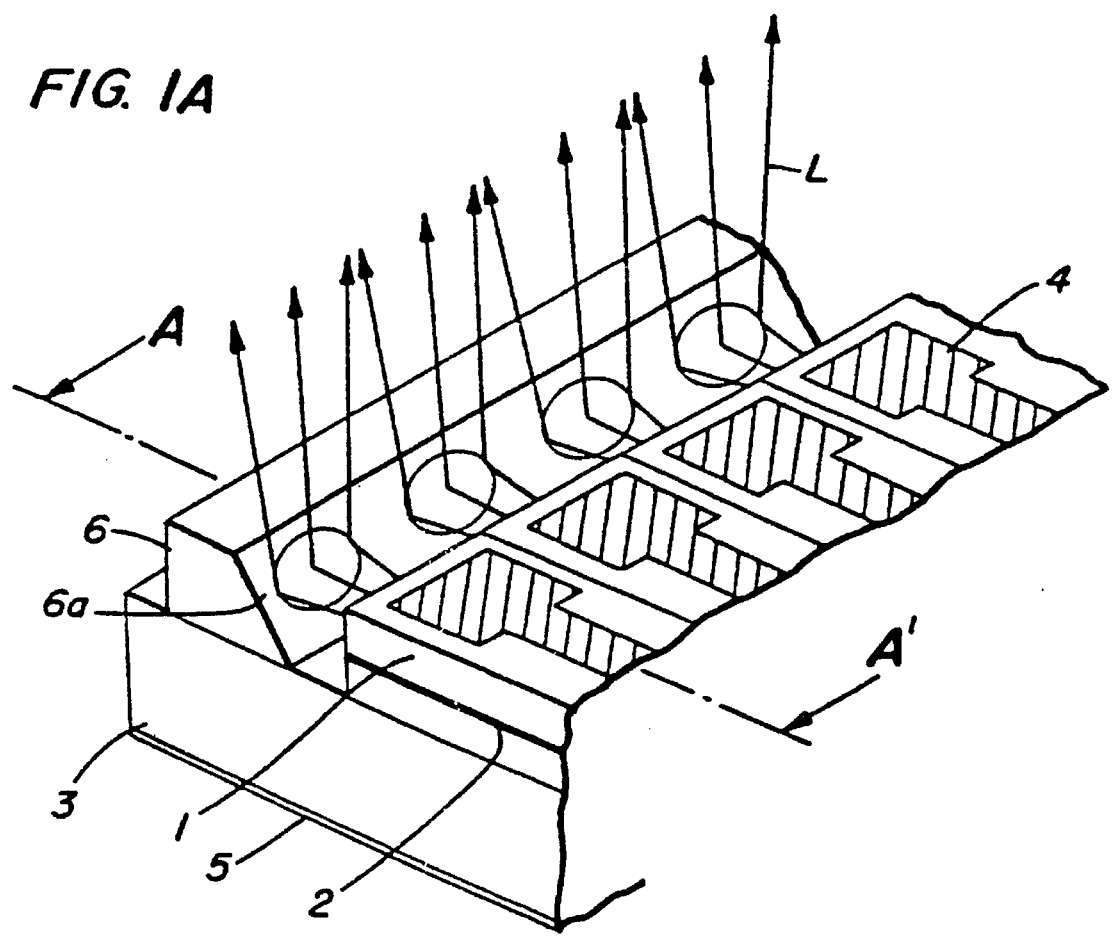
FIG. 1(a) is a perspective view of first embodiment of an LED array head according to the current invention.
Figure 1B:
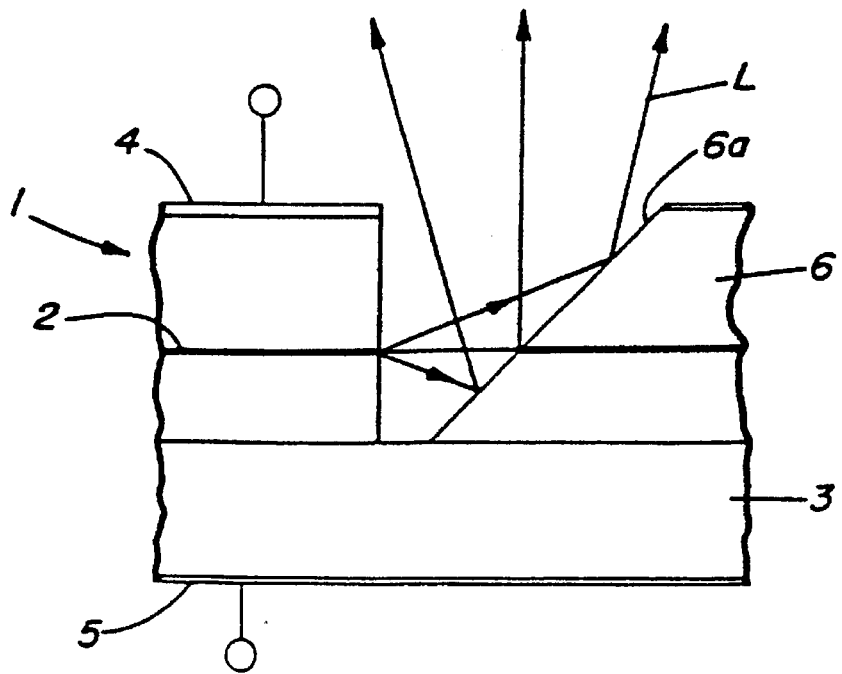
FIG. 1(b) is a cross-sectional view at the line A—A in FIG. 1(a)

FIG. 1(a) in a perspective view of an embodiment of a LED array head according to the current invention. FIG. 1(b) is a cross-sectional view taken at a line A—A as shown in FIG. 1(a). The end surface or edge emitting type LED 1 with a semi-conductor structure includes an active layer 2; a base plate 3; electrodes 4, 5; a reflecting element 6 and a reflecting surface 6a.

Figure 38:
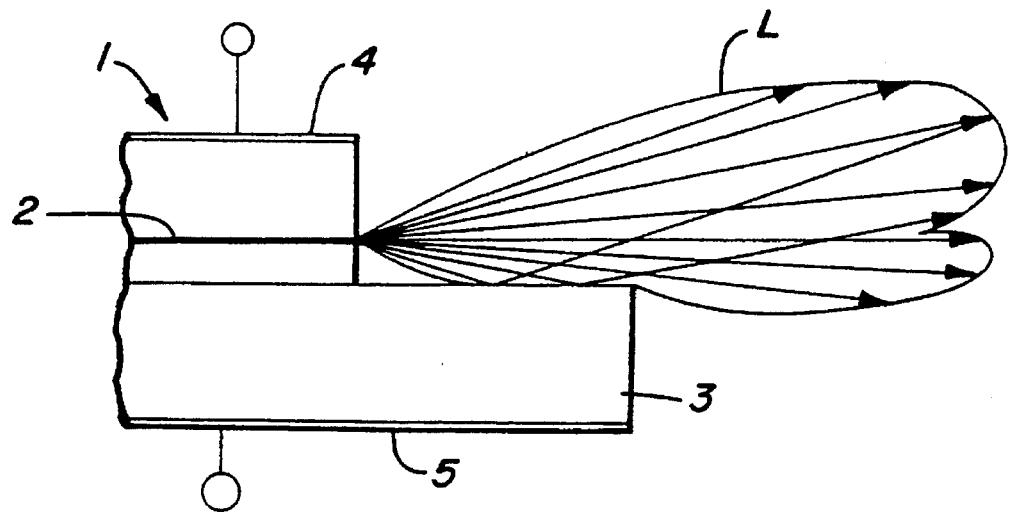
FIG. 38 is a sectional view of the edge emitting LED array head of prior art.
Figure 39:
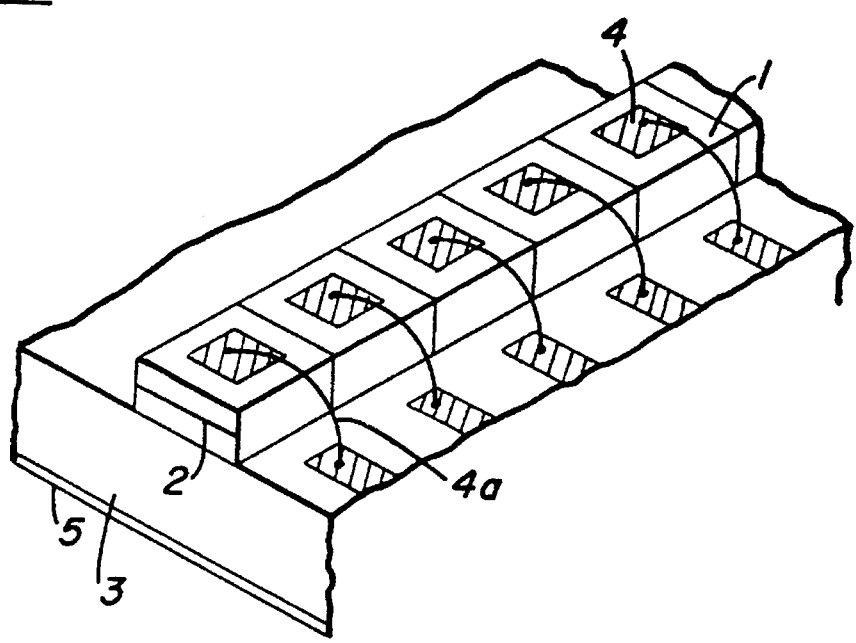
FIG. 39 is a perspective view showing prior art wire bonding of an edge emitting LED array head of related arts.

An LED array head of a preferred embodiment according to the current invention contains a plurality of end surface emitting LED elements which are positioned at least in one row. A reflecting element 6 is disposed on the base plate 3 and directs a luminous flux L emitted from the LED elements 1 in a substantially perpendicular direction. In this embodiment, the reflecting surface 6a of the reflecting element 6 is a substantially flat plane. Without the reflecting element 6, a part of a luminous flux emitted from an edge surface of the LED elements 1 is reflected on the base plate 3 as shown in FIG. 38. Therefore, a light emitting pattern becomes uneven. When such a luminous flux with an uneven pattern is converged by an optical focusing systems, it is difficult to form minute beam spots on an image surface of a photoconductive member. According to the current invention, an uneven light emitting pattern is substantially eliminated since a luminous flux is not reflected by the base plate. Further, a pair of the above LED array and a reflecting element is placed in plural lines so as to form a two-dimensional array.

In the LED array head as shown in FIG. 1, because the reflecting element 6 is made of the same material as the LED elements 1, the LED elements 1 and the reflecting element 6 are simultaneously formed. That is, if the reflecting elements 6 are formed by ionic beam edging during a semiconductor forming process, the LED arrays of FIG. 1 are easily manufactured.

Referring to FIG. 1(b), in a preferred embodiment, the distance 1 between the reflective element 6 and the LED element 1 is generally determined so that a luminous flux is reflected by the reflective element 6 before the luminous flux reached the base plate. In particular, the above distance 1 is described in relation to an angle α and a height h. The angle α is an angle of a luminous flux emitted from the active layer 2, which is located at a height h from the base plate 3. To satisfy that the luminous flux is reflected before it reaches the base plate, the distance 1 in a preferred embodiment should be equal to or less than h/tan (α/2).

In general, materials which are used in an LED such as AlGaAs etc. have high reflective indices. For example, AlGaAs has a reflective index of 3.6. Accordingly, the reflecting surface 6a has high reflectance.

Figure 2:
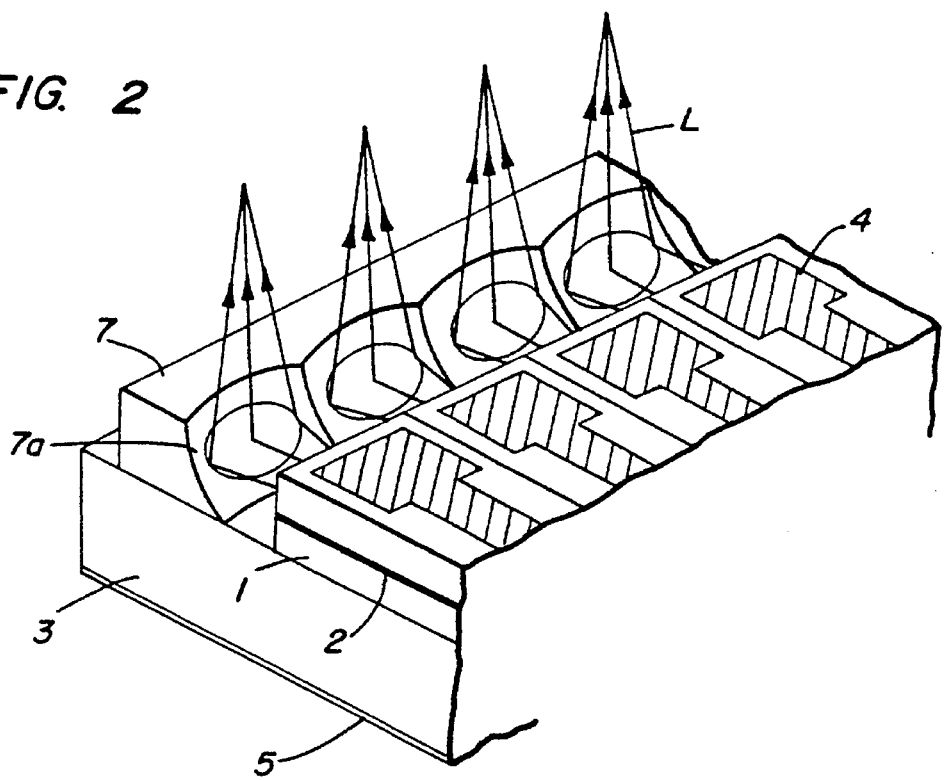
FIG. 2 is a perspective view of a second embodiment of an LED array head with a reflecting element having a curved surface according to the current invention.

FIG. 2 is a perspective view of the second embodiment of an LED array head according to the current invention. In this embodiment, a reflecting surface 7a of a reflecting element 7 is curved. The curved reflecting surface 7a converges a divergent luminous flux emitted from the LED elements 1 and focuses the luminous flux on an image surface. Thus, when the luminous flux is converged by a certain extent before the luminous flux is projected into an optical focusing element such as a rod array, an optical head has high coupling efficiency. Instead of using a common unit magnification focusing element, if each LED element has a corresponding local focusing element, the coupling efficiency is substantially higher. Furthermore, the corresponding focusing elements substantially prevent the formation of uneven beam spot due to dispersed light or flared light at connecting portions.

If a reflecting surface 7a of a reflecting element 7 comprises a concave spherical surface, a luminous flux L emitted from the active layer 2 of the LED element 1 is converged or focused in a main scanning or LED array direction as well as in a sub-scanning direction perpendicular to the main scanning direction on an image surface under the same connecting power. Further, to correct wave front aberration, the reflecting element surface 7 is constructed to be co-axial asphere.

If the reflecting element 7 has a concave cylindrical shape, and the curved surface 7a extends only in the main scanning direction, a luminous flux L emitted from the LED element 1 is converged or focused only in the main scanning direction. Since an edge emitting type LED element has a wide diffusion angle in the main scanning direction, a cylindrical surface is advantageous. In addition, the manufacture of the reflecting element 7 is substantially facilitated.

If the curved surface of the reflecting element is a cylindrical shape and extends only in the sub-scanning direction, a luminous flux L emitted from the LED element 1 is converged or focused only in the sub-scanning direction. Generally, if this reflecting element is used together with other optical focusing elements, the focusing elements generate eclipse of luminous flux in the sub-scanning direction. However, the eclipse may be reduced to achieve an optical head having a high coupling efficiency. Furthermore, the reflecting element 7 is more easily manufactured than a concave spherical surface.

When a reflecting surface 7a of a reflecting element 7 comprises an anamorphotic surface whose curvatures are different between main scanning direction and in the sub-scanning direction, a luminous flux L emitted from the LED element 1 is converged or focused under different connecting powers in these two directions. In general, emitting points of conventional LED's in the main scanning and sub-scanning directions are different. In other words, since there is astigmatism due to the anamorphic surface, minute beam spots are advantageously formed.

A luminous flux is simultaneously focused in the main scanning direction as well as in the sub-scanning direction if the curved surface 7a of the reflecting element 7 is spherical. However, when an LED has an emitting point with a large difference in the main scanning direction and the sub-scanning direction, astigmatism still occurs. Accordingly, a long cylindrical lens having a refractive power in sub-scanning direction is placed over the structure of FIG. 2 so as to substantially correct astigmatism.

Figure 3:
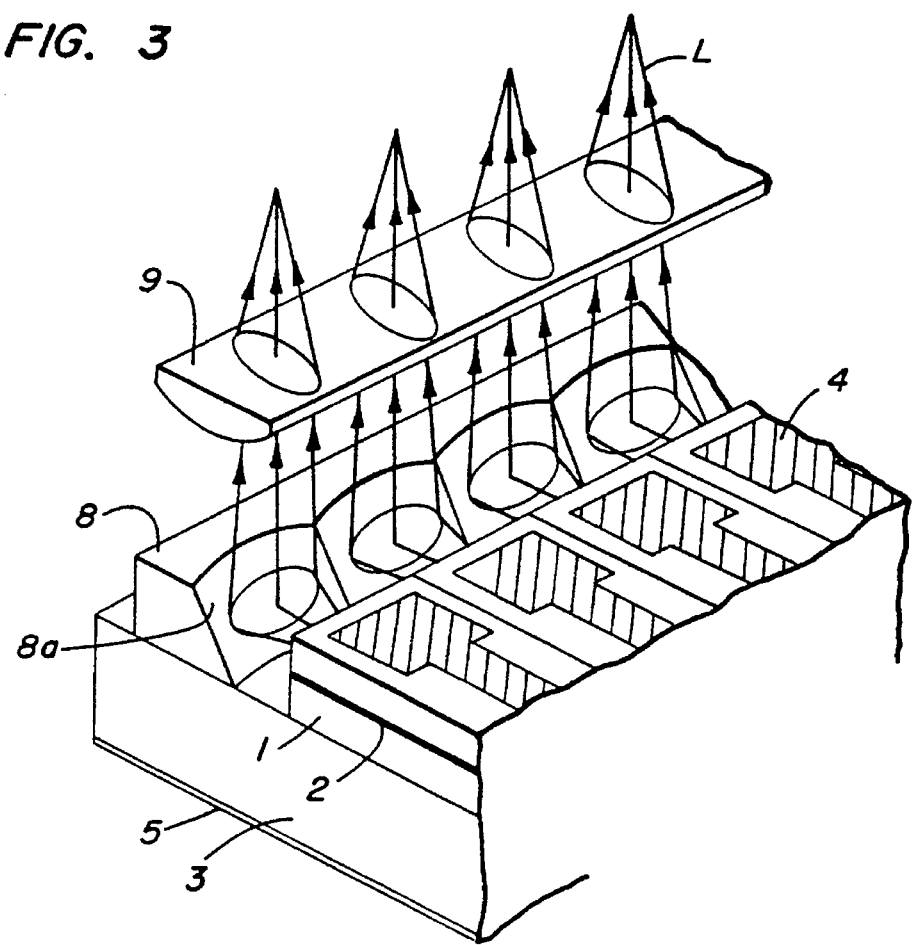
FIG. 3 is a perspective view of a third embodiment of an LED array head with a curved reflecting element with an overhead cylindrical lens according to the current invention.

FIG. 3 illustrates a third embodiment in which a long cylindrical lens 9 is curved only in the sub-scanning direction is placed over the reflecting element 8. The cylindrical reflecting surface 8a is curved only in the main scanning direction and a luminous flux emitted from the LED element 1 is focused only in the main scanning direction on an image surface. However, the cylindrical lens 9 focuses the image in the sub-scanning direction. In this way, a luminous flux is focused evenly in both the main and sub-scanning directions. In general, the above-mentioned structure corrects astigmatism of LED elements.

Since the long cylindrical lens is used, dispersion of light quantity between rod lens arrays and deterioration of focusing performance are substantially eliminated. In comparison to a conventional optical unit magnification focusing system using rod array lens, the manufacturing cost may be reduced.

Figure 4:
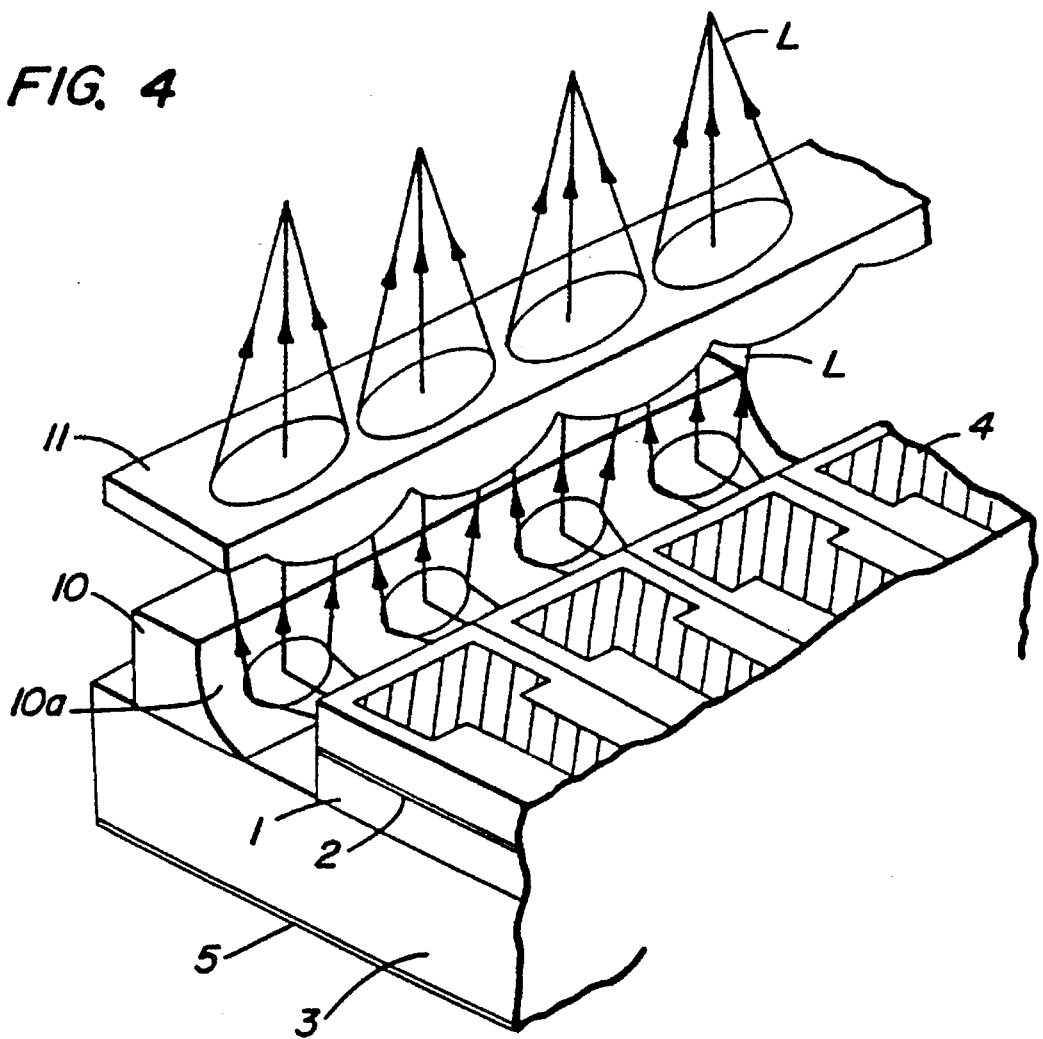
FIG. 4 is a perspective view of a fourth embodiment of an LED array head with curved reflecting surface with an overhead cylindrical lens according to the current invention.

Referring now to FIG. 4, in this fourth embodiment, a reflecting element 10 comprises a reflecting surface 10a which is curved in the sub-scanning direction. Because of the curvature, a luminous flux emitted from an LED element is focused only in the sub-scanning direction on an image surface. A cylindrical lens array 11 is curved in the main scanning direction, and it is placed over reflecting element 10. Because of a combination of these curvatures, a luminous flux is focused evenly in both the main and sub-scanning direction.

Figure 5:
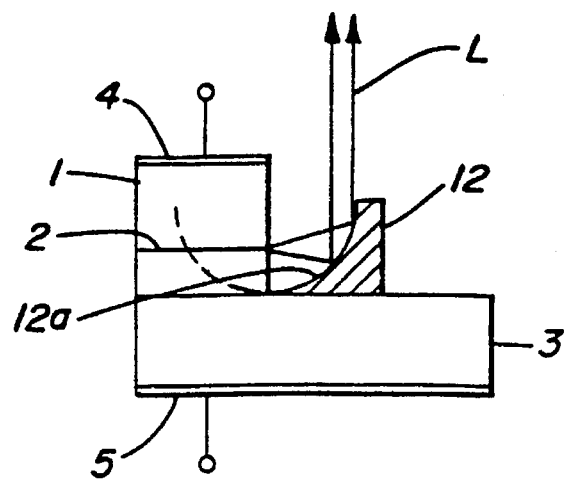
FIG. 5 is a cross-sectional view of the fifth embodiment of the end surface emitting type LED array with a parabolic reflecting surface.

FIG. 5 is a cross-sectional view of an LED array head according to the fifth embodiment of the present invention. A reflecting element 12 is provided adjacent to the LED array 12 and directs a luminous flux from an LED element 1 in a substantially vertical direction with respect to an emitting direction. The reflecting LED element 12 has a cylindrical reflecting surface which comprises a paraboloid in the sub-scanning direction. Therefore, a luminous flux hardly reaches a base plate because the luminous flux from each LED element 1 is directed upwardly in the substantially vertical direction before reaching the base plate 3. If a focus point of the paraboloid is adjusted with respect to the emitting point of the LED element 1, a luminous flux is made parallel in the sub-scanning direction and unevenness of light emission patterns is also prevented. At the same time, this adjustment makes it easy to form two dimension arrays of LED's.

Figure 6:
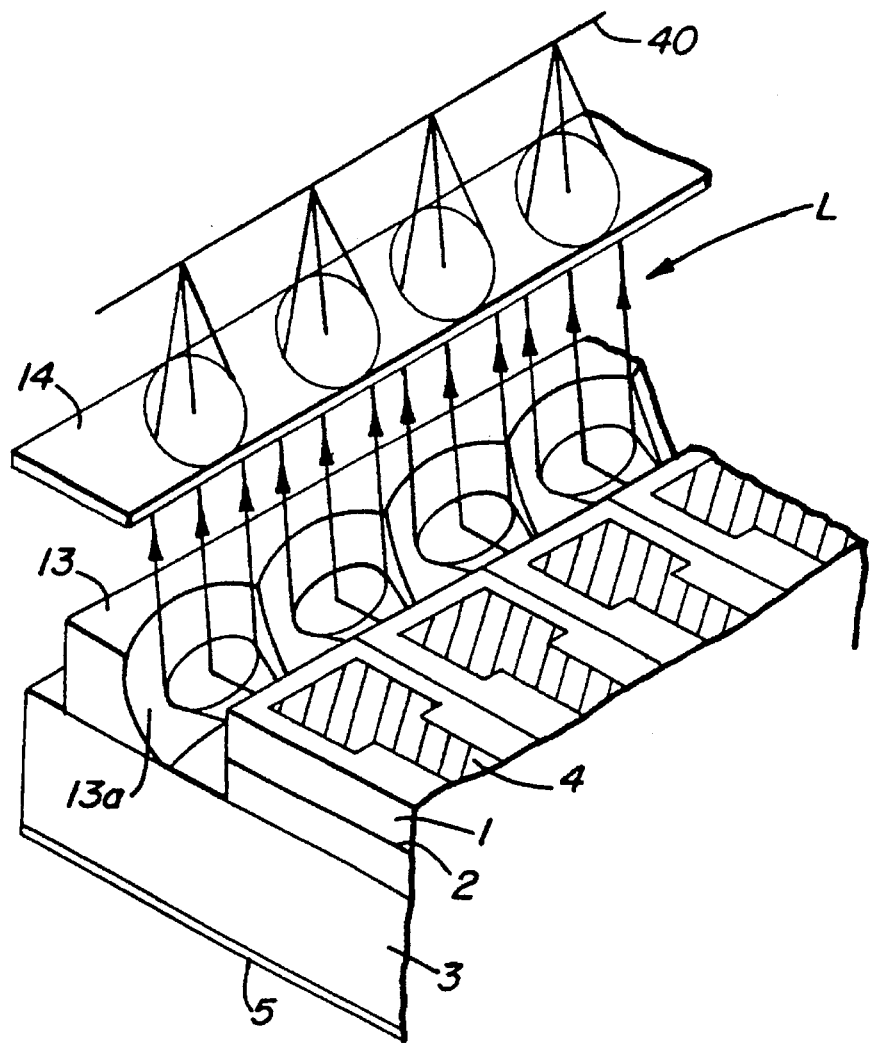
FIG. 6 is a perspective view of the sixth embodiment of the LED array with a partially parabolic reflecting surface.

FIG. 6 is a perspective view of the sixth embodiment of the LED array head. A reflecting element 13 reflects a luminous flux from an LED element 1 in a substantially vertical direction with respect to the emitted direction. The reflecting element 13 is provided adjacent to the LED array, and a reflecting surface 13a of the LED element 13 has a curved surface which comprises a partial paraboloid. Therefore, since the luminous flux is directed in parallel to the sub-scanning as well as main scanning directions, lens array 14 converges the luminous flux from the reflecting element 13 to focus an image on an image surface such as a photoconductive drum. Furthermore, the distance between the LED array head and the image surface 40 may be changed since the luminous flux is made parallel by the paraboloid of the reflecting element 13.

Figure 7:
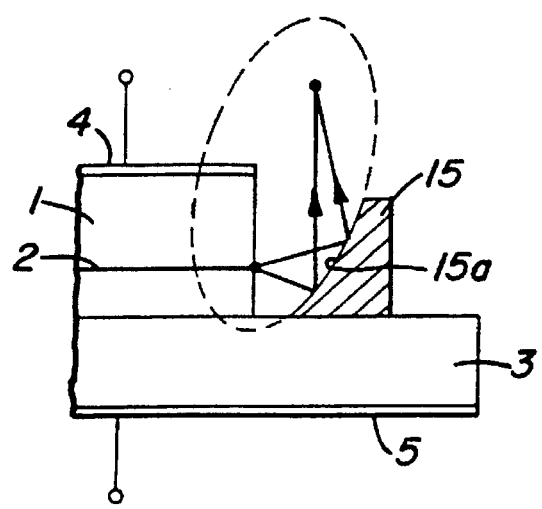
FIG. 7 is a cross-sectional view of the seventh embodiment of the LED array with an ecliptic reflecting surface.

FIG. 7 is a cross-sectional view of the seventh embodiment of the LED array head. A reflecting element 15 is provided adjacent to the LED array 12 reflecting a luminous flux from an LED element 1 in a substantially vertical direction with respect to an emitting direction. A reflecting surface 15a of the reflecting element 15 has a curved surface which comprises a partial ellipse in the sub-scanning direction. It is possible to focus on another focus point by adjusting a focus point of the ellipse with respect to the emitting point of the LED element 1. Therefore, the luminous flux can be focused in the sub-scanning direction, and the uneven light emitting pattern is substantially avoided.

Figure 8:
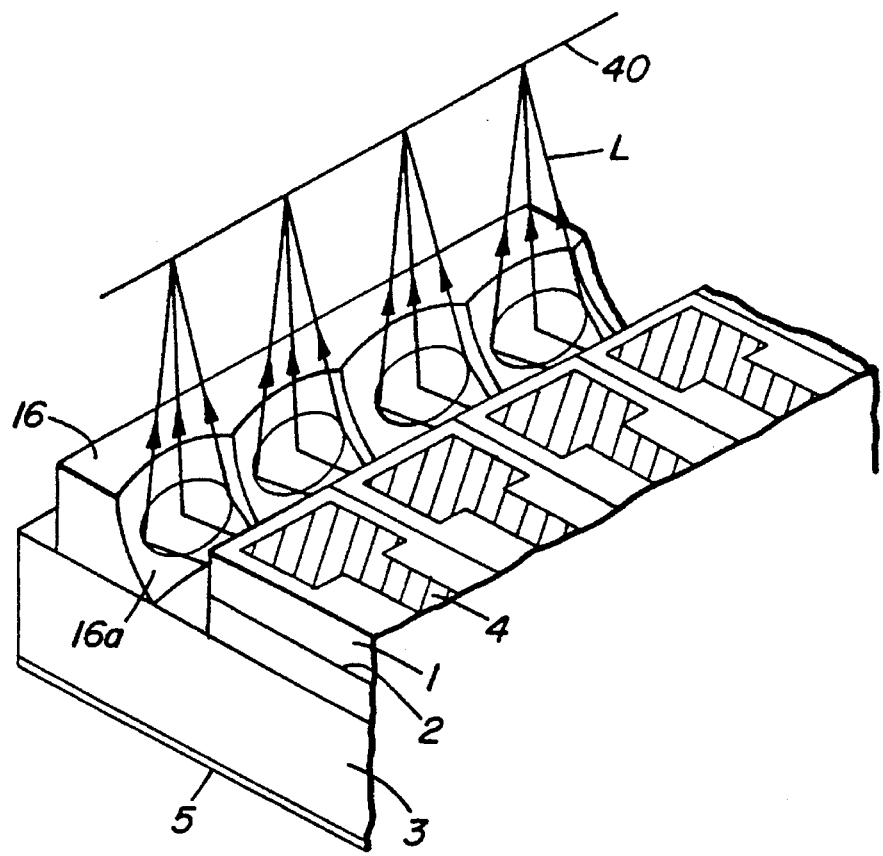
FIG. 8 is a perspective view of the eighth embodiment of the LED array with a partial ecliptic reflecting surface.

FIG. 8 is a perspective view of the eighth embodiment of the LED array head. A reflecting element 16 is provided adjacent to the LED array for directing a luminous flux from an LED element 1 in a substantially vertical direction with respect to the emitting direction. A reflecting surface 16a of the reflecting element 16 has a curved surface which comprises a part of an ellipse shape in the sub-scanning direction. Since the reflecting element 16 focuses a luminous flux on an image surface 40 such as a photoconductive drum without an optical focusing element such as a lens array, an array head has been simplified. The array head as shown in FIG. 8 also substantially eliminates the uneven light emitting pattern as well as crosstalk between the LED elements. Lastly, a focusing point may be changed by modifying the ecliptic surface of the reflecting element 16. Accordingly, these modifications allow the LED array head design to be flexible.

Figure 9:
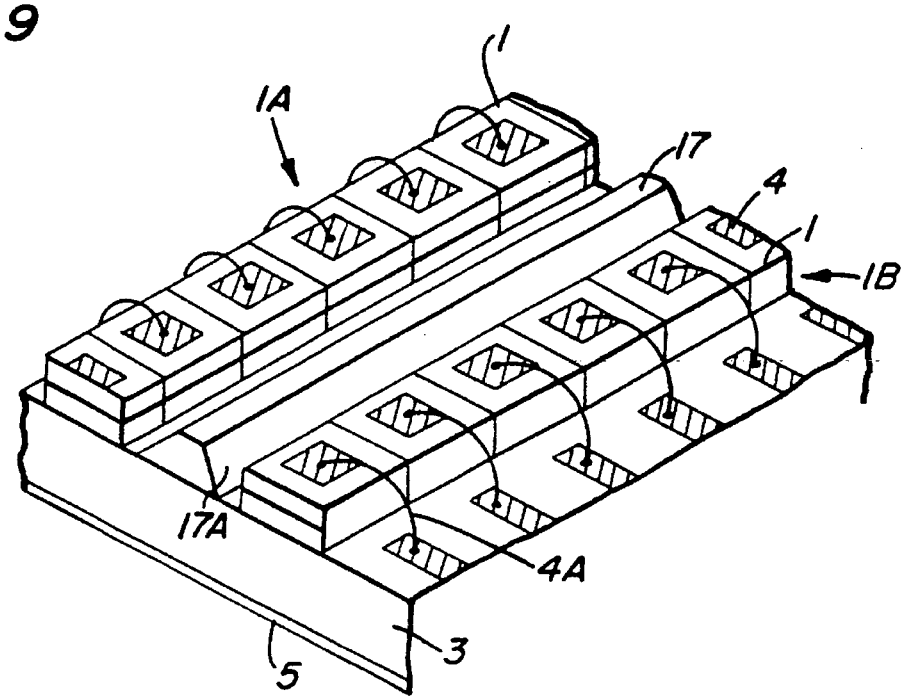
FIG. 9 is a perspective view of the ninth embodiment of the LED array with alternatively positioned two rows of end surface emitting LED.
Figure 10:
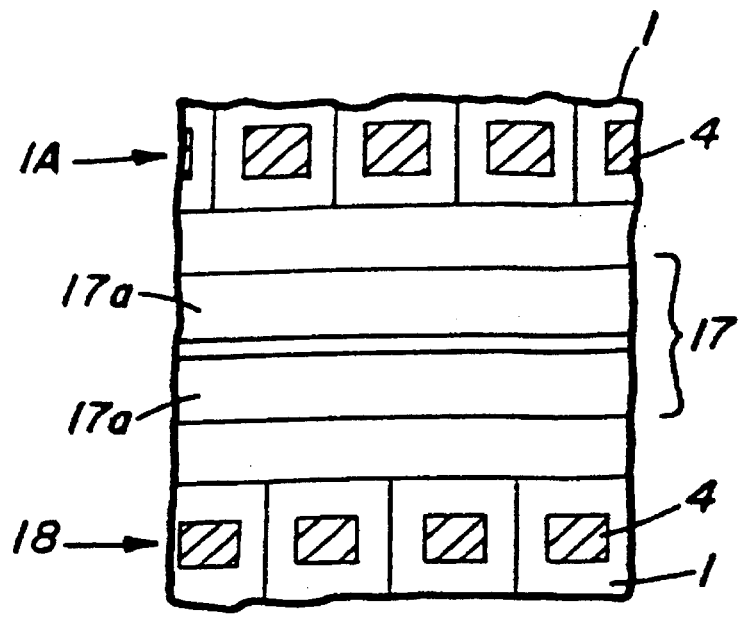
FIG. 10 is a plain view of the ninth embodiment of the LED array.
Figure 11:
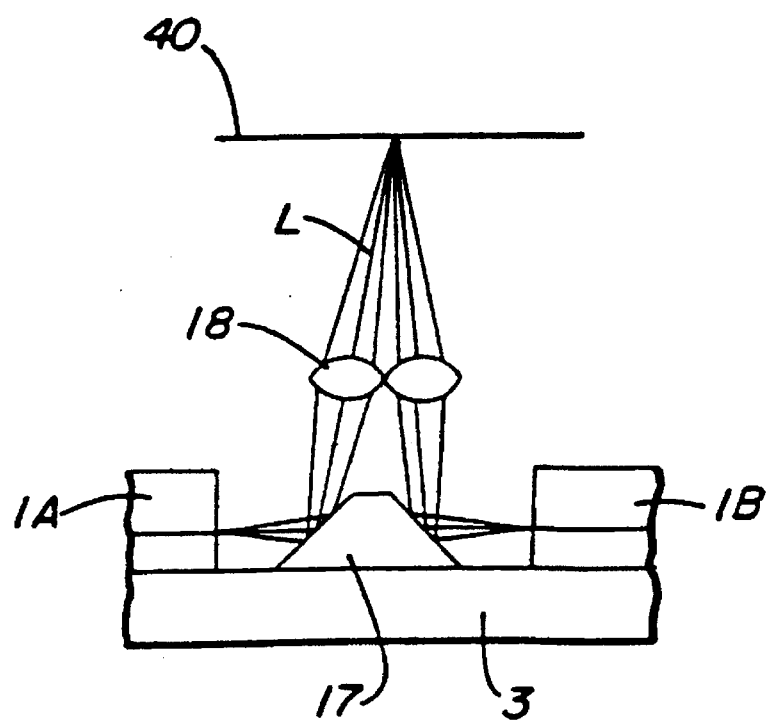
FIG. 11 is a cross-sectional view of the ninth embodiment of the LED array.

FIG. 9 is a perspective view of the ninth embodiment of the LED array head. FIG. 10 is a plain view of the same embodiment of the LED head, while FIG. 11 is a cross-sectional view of the LED array head. A plurality Of edge emitting type LED elements 1 are disposed in two parallel rows in such a way that the emitting directions of edge emitting LED's 1A and 1B are opposed with each other. However, light emitting points (emitting dots) of the LED arrays of the two lines are alternatively positioned and do not directly align with each other between the two rows. Reflecting elements 17 are located between the rows 1A and 1B and direct light flux. Shapes of reflecting surface 17a of the reflecting elements 17 include a flat, paraboloid, or ellipse, etc. as described in the above second through eighth embodiments. As shown in FIG. 11, focusing lenses 18 are optionally provided to focus each reflected light flux. Still referring to FIG. 9, alternatively arranged emitting points of the LED arrays 1A and 1B enable a smaller interval between electrode patterns 4 and wire bonding 4a for denser LED arrays.

In the second to ninth embodiments of the LED array head, the reflecting elements 7, 8, 10, 12, 13, 15, 16 and 17 may be made of the same material as that of the LED element. That is, after semi-conductive layers are formed by a semi-conductive producing process, an LED element portion and a reflecting element can be separated by an ionic beam edging processing. Therefore, it is easier to make reflecting elements from the same material than later attaching the separate reflecting elements. Since materials used for LED elements such as AlGaAs (the reflective index is about 3.6) etc. generally have a high reflective index, a reflecting surface is made with a high reflective index.

Figure 12:
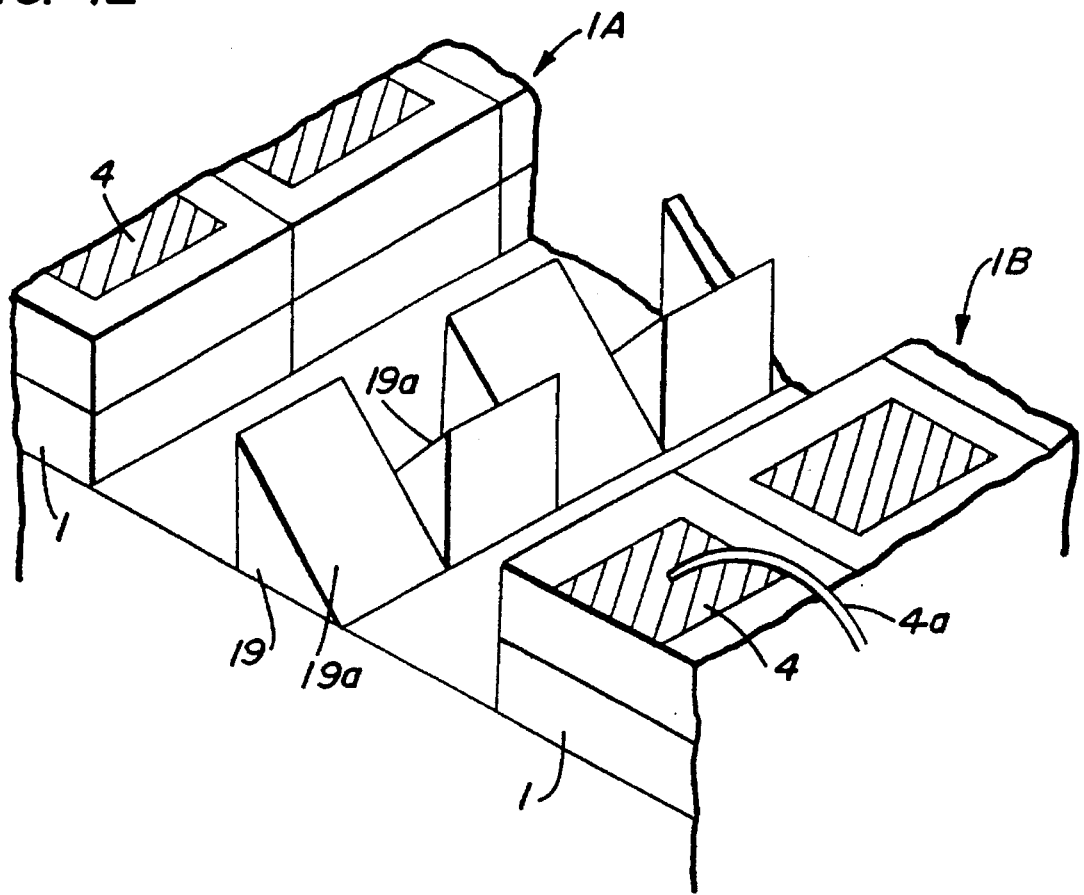
FIG. 12 is a perspective view of the tenth embodiment of the LED array with alternatively positioned reflecting elements.

FIG. 12 is a perspective view of an LED array head. In this embodiment, a plurality of edge emitting type LED elements 1 is disposed in two parallel rows so that emitting directions of LED arrays 1A and 1B are opposed to each other. Furthermore, light emitting points (emitting dots) of the LED elements are alternatively positioned for corresponding reflecting elements 19 which direct light flux. The reflecting elements 19 are arranged so that the light flux from the LED arrays 1A and 1B reflect on reflecting points which share a common line. Thus, an image may be focused on a simple line on an image surface by adjusting the inclination of reflecting surfaces 19a of reflecting elements 19.

Figure 13:
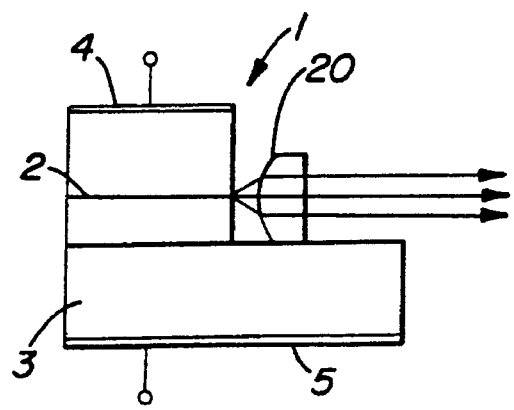
FIG. 13 is a cross-sectional view of the eleventh embodiment of the LED array with a long cylindrical lens.

FIG. 13 is a cross-sectional view of the eleventh embodiment of the LED array head. Elements numbered 1 to 5 are the same as those in the above-described embodiments. An LED array head comprises a plurality of LED elements 1 arranged in an array which is orientated perpendicularly into FIG. 13. The perpendicular direction into the figure is a main scanning direction while a direction intersecting the main scanning direction at right angle is a sub-scanning direction. The sub-scanning direction also runs the active layer 2 of the LED elements 1 in the emitting direction.

As shown in FIG. 13, a luminous flux from each LED element 1 of the LED array is converged in the sub-scanning direction by a cylindrical optical element such as a long cylindrical lens 20 on a base plate 3 adjacent to the LED elements 1. The long cylindrical lens 20 has a refractive power substantially in the sub-scanning direction. That is, a luminous flux from the LED elements 1 is converged in the sub-scanning direction by the cylindrical lens 20 and is adjusted to a parallel luminous flux, a converged luminous flux or a diffused luminous flux before reaching the base plate 3 thereby substantially improving the unevenness of an emitting pattern. Two dimensional LED elements are also made denser by converging the emitted light in the sub-scanning direction. The long cylindrical lens 20 further include convexo-plans lens, convexo-convex lens and convexo-concave lens etc.

Figure 14:
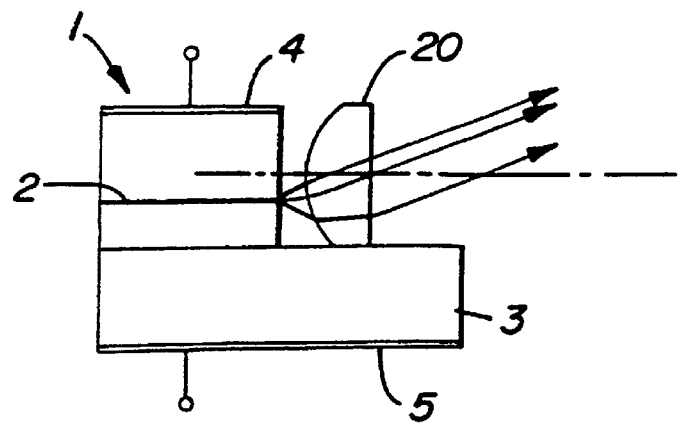
FIG. 14 is a cross-sectional view of the eleventh embodiment of the LED array with the lens center disposed at a different position with respect to the emitting flux.

FIG. 14 is a cross-sectional view of the eleventh embodiment of the LED array head. When a luminous flux from LED elements 1 is converged in a sub-scanning direction, it is possible to turn the luminous flux in a desired direction by positioning a central axis of a cylindrical optical element 20 off the active layer plane 2 of the LED elements 1. Therefore, the cylindrical optical element 20 allows an LED array head to be designed with certain flexibility.

Figure 15:
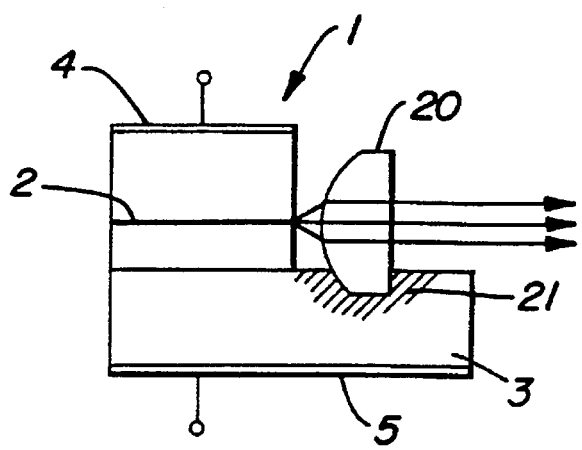
FIG. 15 is a cross-sectional view of the eleventh embodiment of the LED array with the lens partially placed in a recess on the base plate.

FIG. 15 is a cross-sectional view of the eleventh embodiment of the LED array head. A recess 21 is provided on a wafer base plate 3 to partially accept a cylindrical optical element 20 for easy and accurate assembly of the cylindrical optical element 20 in the LED element 1.

Figure 16:
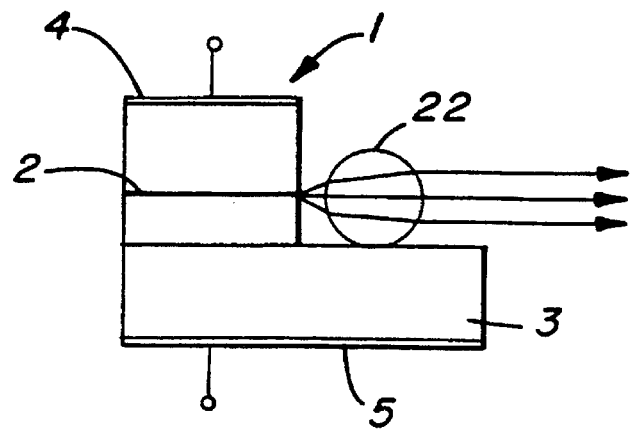
FIG. 16 is a cross-sectional view of the twelfth embodiment of the LED array with a glass fiber lens.

FIG. 16 is a cross-sectional view of the twelfth embodiment of the LED array head. Instead of the cylindrical optical element 20, a fiber such as fiberglass 22 is placed adjacent to the LED array. The central axis of the fiberglass 22 is placed parallel to the main scanning direction. The fiberglass 22 is also capable of converging a luminous flux in the sub-scanning direction and substantially reducing unevenness of an emitting pattern. Further, the fiberglass 22 additionally facilitates the manufacturing and assembling processes and reduces their costs.

Figure 17:
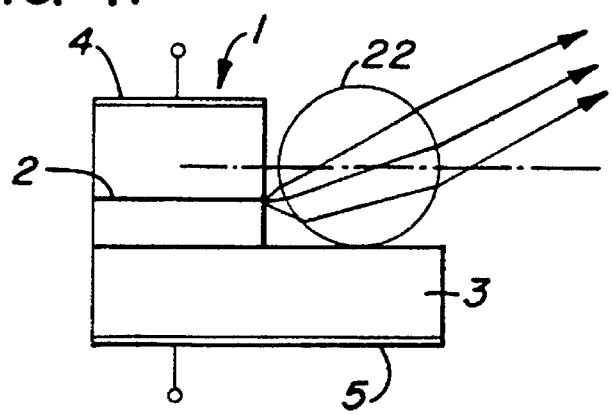
FIG. 17 is a cross-sectional view of the twelfth embodiment of the LED array with the fiber lens center disposed at a different position with respect to the emitting flux.

FIG. 17 is a sectional view of the twelfth embodiment of the LED array head. When a luminous flux is converged in the sub-scanning direction, it is possible to turn the luminous flux from the LED element 1 in a desired direction by positioning a central axis of fiberglass 22 off the active layer plane 2 of the LED array elements 1. This positioning allows the LED array head to be designed with a certain degree of flexibility. Since a focal length may be changed by altering a diameter of the fiberglass 22, emitting directions and the focal length are more easily modified in the fiberglass 2 than in a long cylindrical lens.

Figure 18:
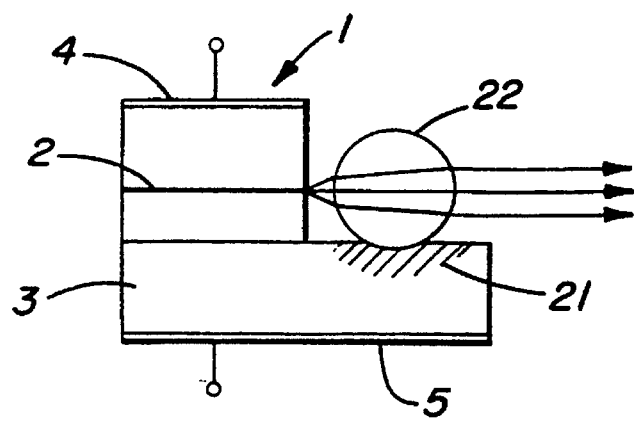
FIG. 18 is a cross-sectional view of the twelfth embodiment of the LED array with the fiber lens partially placed in a recess on the base plate.

FIG. 18 is a cross-sectional view of the twelfth embodiment in the LED array head. A recess 21 in provided on a wafer base plate 3 to position the fiberglass 22 for easy and accurate assembly of the fiberglass 22. Further, it is possible to change an emitting direction of the luminous flux by adjusting the depth of the recess 21.

Figure 19:
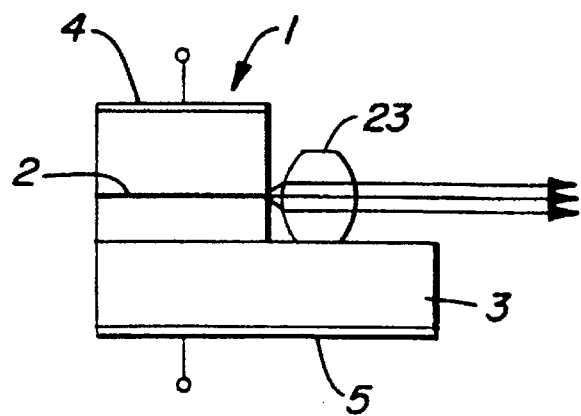
FIG. 19 is a sectional view of the thirteenth embodiment of the LED array with a lens array.
Figure 20:
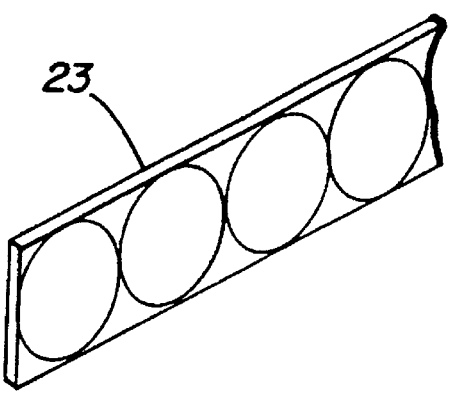
FIG. 20 is a perspective view of the lens array as shown in FIG. 19.

FIG. 19 is a cross-sectional view of the thirteenth embodiment of the LED array head. An array of lenses 23 is placed on a base plate 3 adjacent to the active layer 2 for coupling a luminous flux from each LED elements 1 of the LED array. An example of the lens array 23 is shown in FIG. 20. Before a luminous flux from the LED elements 1 reaches the base plate 3, the luminous flux is converged in the sub-scanning direction by the lens array 23 and is adjusted into a desired state such as parallel, converged or diffused luminous flux. This embodiment substantially eliminates unevenness in an emitting pattern and also provides a refractive power in the main scanning direction.

In the eleventh through thirteenth embodiments, the main direction is not referred to, but a focusing system for both main and sub-scanning directions may be implemented by placing a cylindrical array etc. which has power in the main scanning direction near the cylindrical optical element 20 or the fiber 22.

Figure 21:
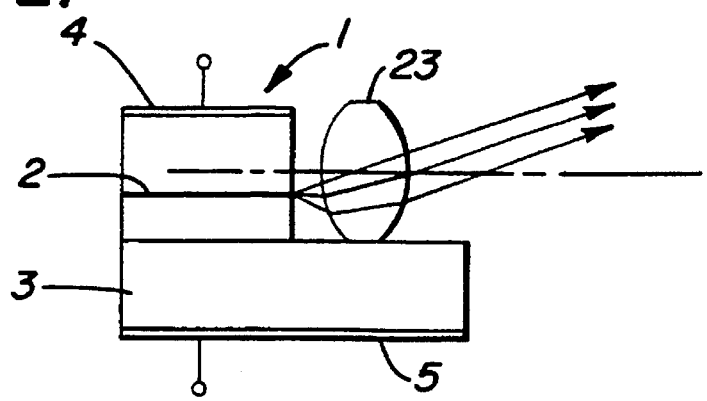
FIG. 21 is a cross-sectional view of the thirteenth embodiment of the LED array with the lens array center disposed at a different position with respect to the emitting flux.

FIG. 21 is a cross-sectional view of the thirteenth embodiment of the LED array head. When a luminous flux is converged in a sub-scanning direction, the luminous flux from the LED elements 1 may be turned in a desired direction by positioning a central axis of the lens array 23 off the active layer plane 2 of LED array elements 1. This positioning allows the LED array head to be designed with flexibility.

Figure 22:
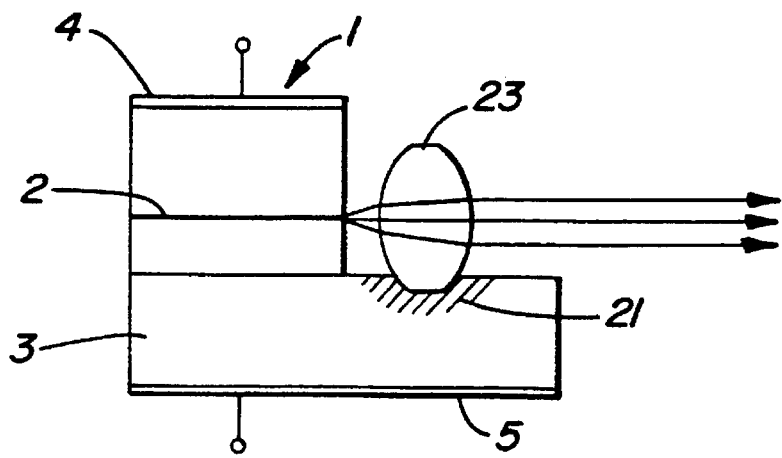
FIG. 22 is a cross-sectional view of the thirteenth embodiment of the LED array with the lens array partially disposed in a recess on the base plate.

FIG. 22 is a cross-sectional view of the thirteenth embodiment of the LED head. A recess 21 is provided on a base plate 3 to position the hens array 23. The lens array 23 is partially placed in the recess 21 for easy and accurate assembly of the lens array 23.

Figure 23:
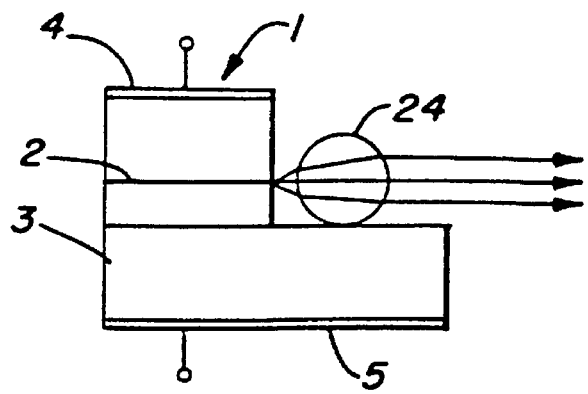
FIG. 23 is a cross-sectional view of the fourteenth embodiment of the LED array with a spherical lens.

FIG. 23 in a cross-sectional view of the fourteenth embodiment with a lens array 23 of the LED head. The lens array 23 comprises spherical lenses 24. The spherical lenses 24 are easier to adjust their optical length by changing a diameter of the sphere than other ordinary lens arrays.

Figure 24:
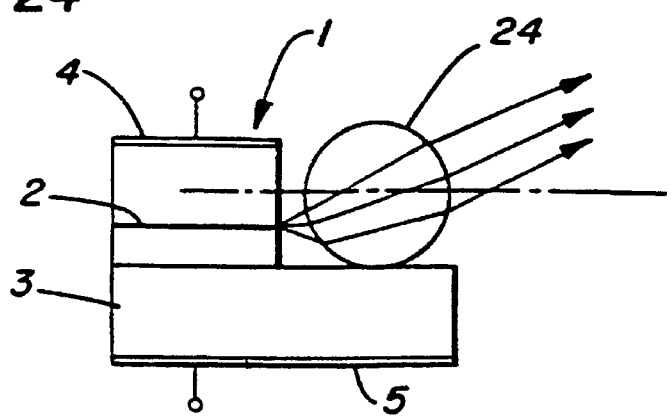
FIG. 24 is a sectional view of the fourteenth embodiment of the LED array with the spherical lens center placed at a different position with respect to the emitting flux.

FIG. 24 is a cross-sectional view of the fourteenth of the LED array head. When a luminous flux is converged in a sub-scanning direction, the luminous flux from the LED element 1 may be turned in a desired direction by moving a central axis of the spherical lens 24 off the active layer plane 2 of the LED array element 1. This positioning allows an LED array head to be designed with flexibility.

Figure 25:
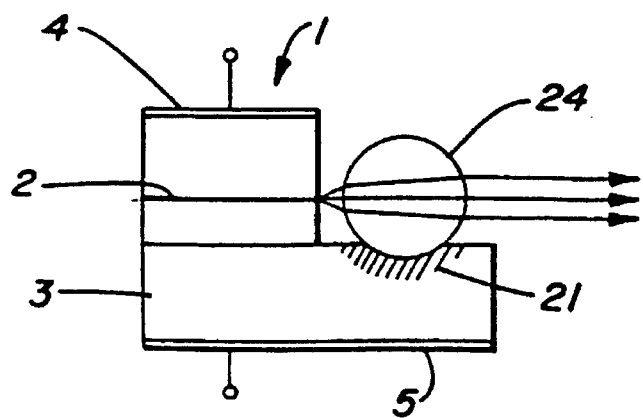
FIG. 25 is a cross-sectional view of the fourteenth embodiment of the LED array with the spherical lens partially disposed in a recess on the base plate.

FIG. 25 is a cross-sectional view of the fourteenth embodiment of the LED array head. A recess 21 is provided on a wafer base plate 3 to position the spherical lens array 24 in the recess 21, thereby making the spherical lens array assembly easy and accurate. Further, since a diameter of the spherical lens 24 changes a focal length, emitting directions or optical lengths of luminous flux is easily modified.

Figure 26:
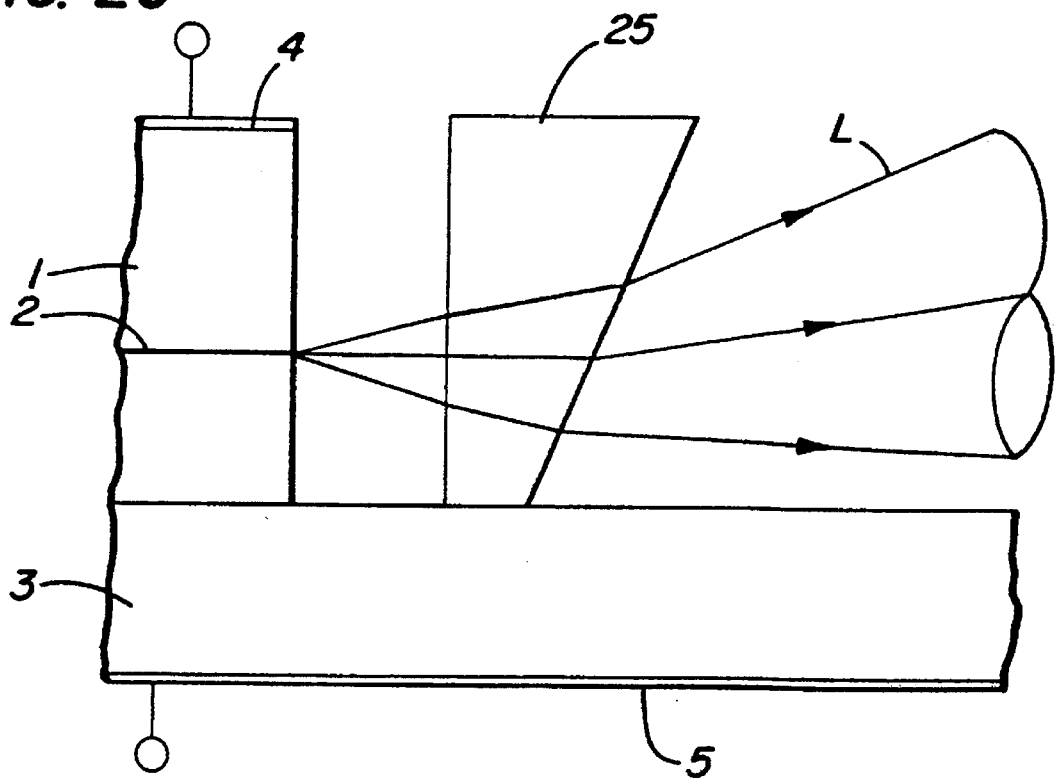
FIG. 26 is a cross-sectional view of the fifteenth embodiment of the LED array with a prism.

FIG. 26 is a cross-sectional view of the fifteenth embodiment of the LED array head. A prism 25 is provided on a base plate 3 adjacent to an LED array to direct a luminous flux from LED elements 1. The prism 25 may be in contact with an emitting portion of the LED elements 1. Since the prism 25 directs a luminous flux right after being emitted from the LED element 1, the luminous flux does not reach the base plate 3 thereby substantially reducing unevenness of the emitting pattern of an edge emitting type LED array. The prism 25 may be a part of a two-dimension LED array head.

Figure 27:
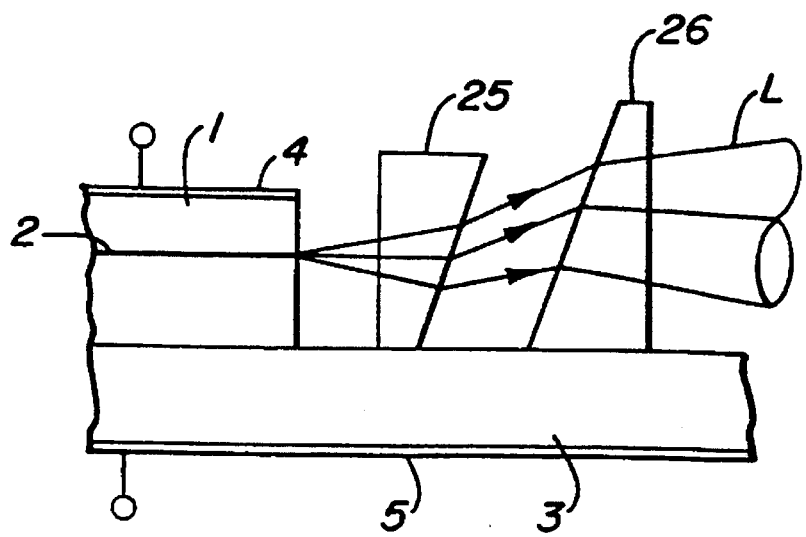
FIG. 27 is a cross-sectional view of the sixteenth embodiment of the LED array with a plurality of prisms placed in the sub-scanning direction.

FIG. 27 is a sectional view of the sixteenth embodiment of the LED array head. Another prism 26 is added to further direct a luminous flux in the same direction as the emitting direction. The prism 25 disposed adjacent to the LED elements 1 may be in contact with an emitting portion of the LED element 1. Prism 26 further directs the luminous flux in the same direction as the emitting direction parallel to the base plate 3. This additional prism 26 further provides a means to facilitate the optical design.

Figure 28:
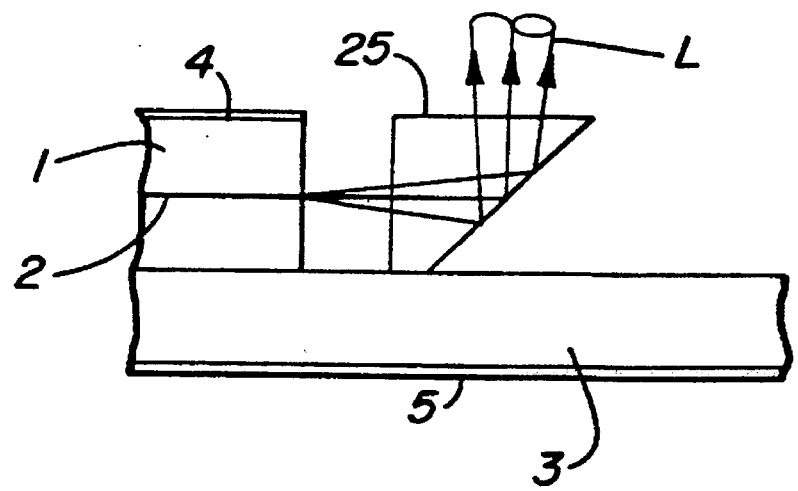
FIG. 28 is a cross-sectional view of the seventeenth embodiment of the LED array with a reflective prism.

FIG. 28 is a sectional view of the seventeenth embodiment of the LED array head. A reflective prism 25 reflects a luminous flux emitted from an LED element 1 in a direction perpendicular to an emitting direction. Since the luminous flux is prevented from reaching a base plate and is directed in a direction perpendicular to the base plate 3, unevenness of an emitting pattern is substantially eliminated. The reflective prism allows optical systems to be designed easily. The prism 25 may be in contact with an emitting portion of the LED element 1.

Figure 29:
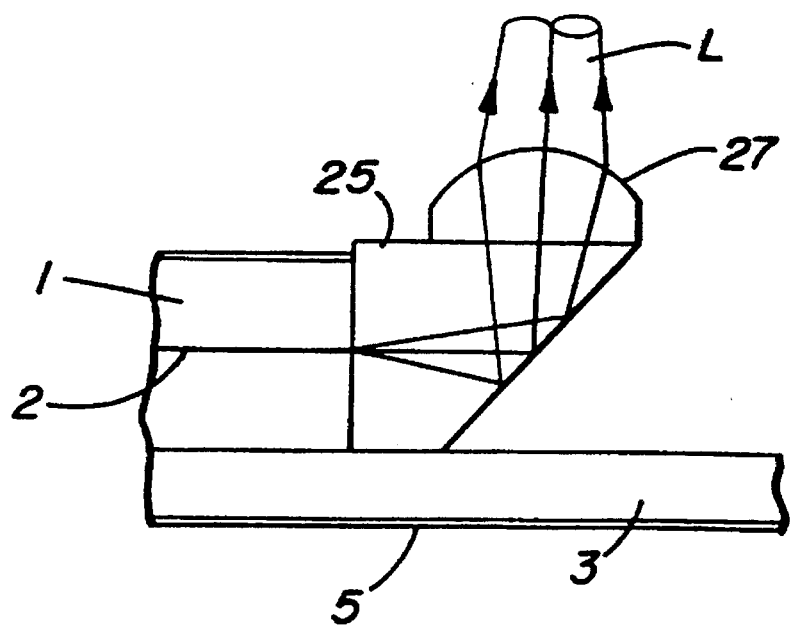
FIG. 29 is a cross-sectional view of the eighteenth embodiment of the LED array with the prism placed in contact with the base plate having an anamorphic lens.

FIG. 29 is a cross-sectional view of the eighteenth embodiment of the LED array head. An anamorphic lens array 27 has a spherical surface or toroidal surface which has different curvatures in a main and sub-scanning direction. The anamorphic lens is provided on a prism 25. After a luminous flux from LED elements 1 is reflected in a direction perpendicular to a base plate 3 by the prism 25, the luminous flux in the main scanning direction is differently converged or focused from the luminous flux in the sub-scanning direction. In general, in LED elements 1, since the emitting points of outward appearance in a main and sub-scanning direction are different (i.e., as astigmatism), this problem is compensated by the anamorphic lens array 27 and a minute beam spot is formed without astigmatism.

The prism 25 may be in contact with the emitting portion of the LED, and the anamorphic lens array 27 may be in contact with, or an internal part of, the prism 25 thereby miniaturizing the device and reducing the manufacturing cost.

Figure 30:
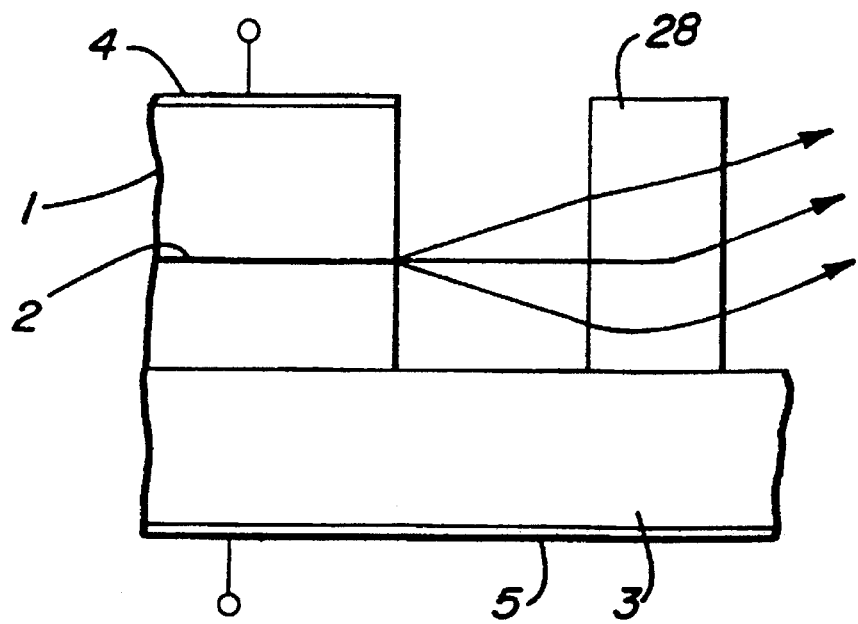
FIG. 30 is a cross-sectional view of the nineteenth embodiment of the LED array, a flat board glass of varying refractive power.
Figure 31:
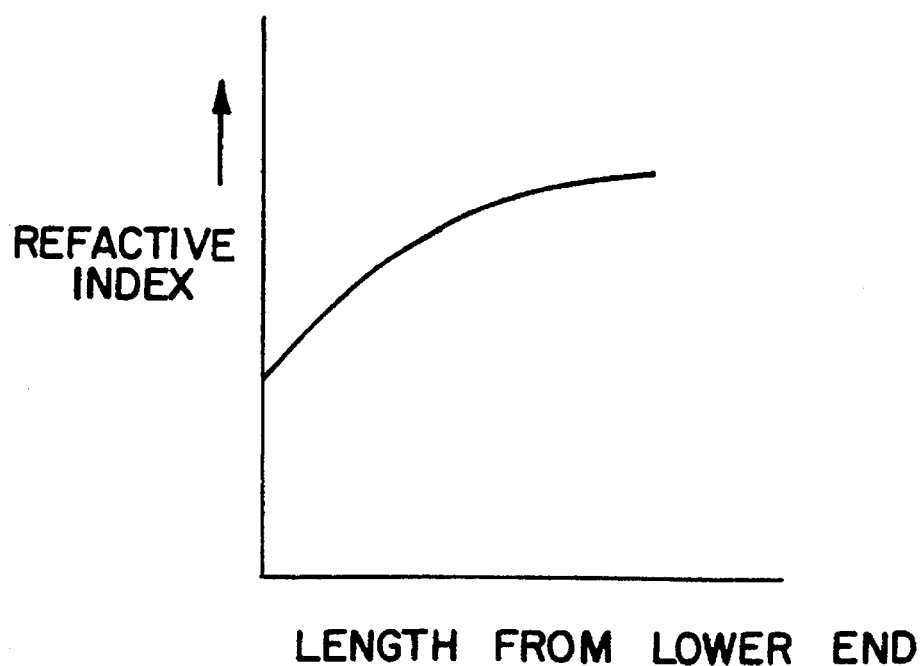
FIG. 31 is a graph showing varying refractive indices of the flat board glass as shown in FIG. 30.

FIG. 30 is a cross-sectional view of the nineteenth embodiment of the LED array head. A parallel flat board glass 28 has a predetermined refractive index and is provided on a base plate 3 adjacent to an LED array. The flat board glass 28 directs a luminous flux in a direction substantially away from an emitting direction. Since a luminous flux emitting toward the base plate 3 is refraxed by the parallel flat board glass 28, the unevenness of an emitting pattern, which is a defect of an edge emitting type LED array, is substantially eliminated. FIG. 31 schematically illustrates the changes of the refractive index of the parallel flat board glass 28 in relation to the length from the bottom of the flat board glass 28.

Figure 32:
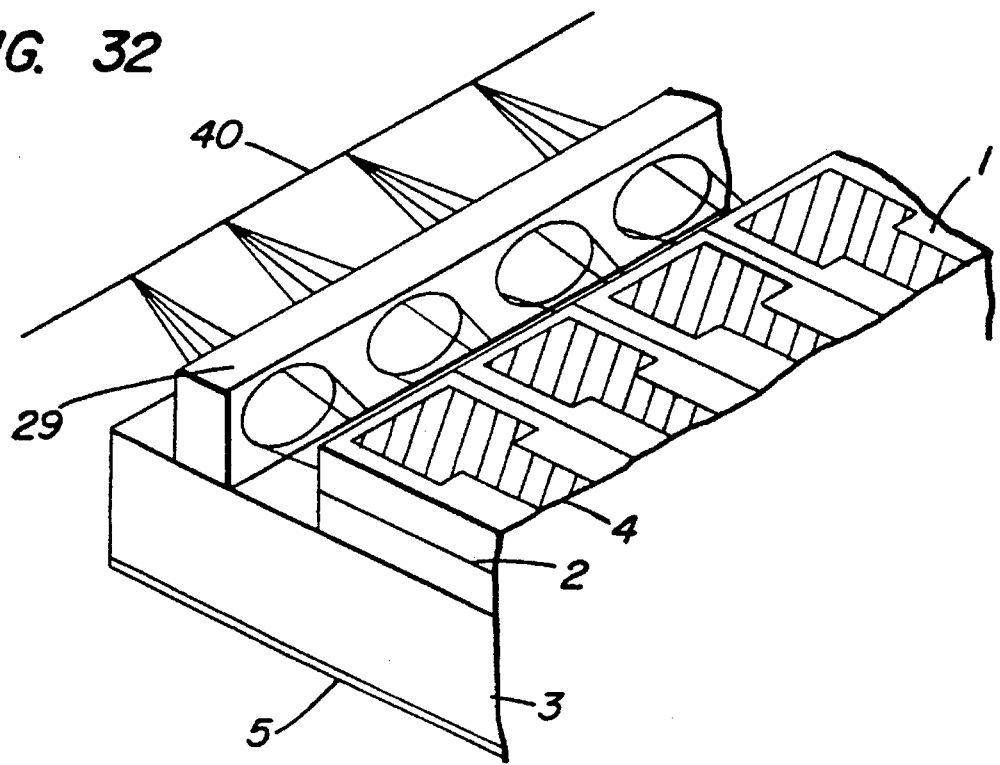
FIG. 32 is a perspective view of the nineteenth embodiment of the LED array with flat micro lens array.

FIG. 32 is a perspective view of the nineteenth embodiment of the LED array head. A flat board micro-lens array 29 is disposed on a base plate 3 adjacent to an LED element. A refractive index of the flat board micro-lens array 29 is designed to become lower as distal an intersecting point between a central axis of a luminous flux emitted from an LED emitting point and a surface of object side of the flat microlens array 29. Since a luminous flux from an edge emitting type LED array has a wide diffusion angle in relation to intervals of emitting points, cross talks may occur between neighboring emitting points when a focusing optical element is placed far from the LED elements. The above-described nineteenth embodiment substantially reduces the cross talks between the emitting points and also unevenness of an emitting pattern because it converges and controls a luminous flux from each emitting point.

Figure 33A:
FIG. 33(a) and (b) respectively illustrates a plain view and a side view of common refractive indices of the flat micro lens array as shown in FIG. 32.
Figure 33B:
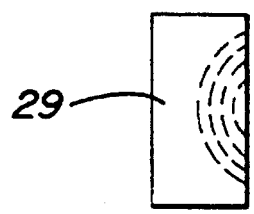

FIG. 33 shows refractive index distribution of flat board micro lens array 29. The dotted lines indicate an extent of the same refractive index. FIG. 33(*a*) illustrates a plain or top view of the flat board micro-lens array 29. FIG. 33(*b*) illustrates a side view facing the main scanning direction.

Referring to FIG. 34 through 37, the twentieth embodiment will be described. As mentioned above, the examples included cylindrical optical elements or lens arrays etc. that are placed on a base plate adjacent to the light emitting surface of edge emitting LED's. If the cylindrical optical elements or lens are provided alone, due to aberration the focus magnification becomes too large to obtain a necessary diameter of a beam spot on an image surface and a compensating lens outside the base plate becomes necessary. The twentieth embodiment takes the above problem into account and substantially prevents luminous flux of an LED array from reflecting on a base plate. This embodiment also substantially prevents aberration from occurring and obtains suitable beam spots with necessary sizes on an image surface such as a photo-conductive3 drum by an optical system on a base plate. The focusing magnification of the optical system is designed to be approximately the predetermined unit magnification.

Figure 34A:
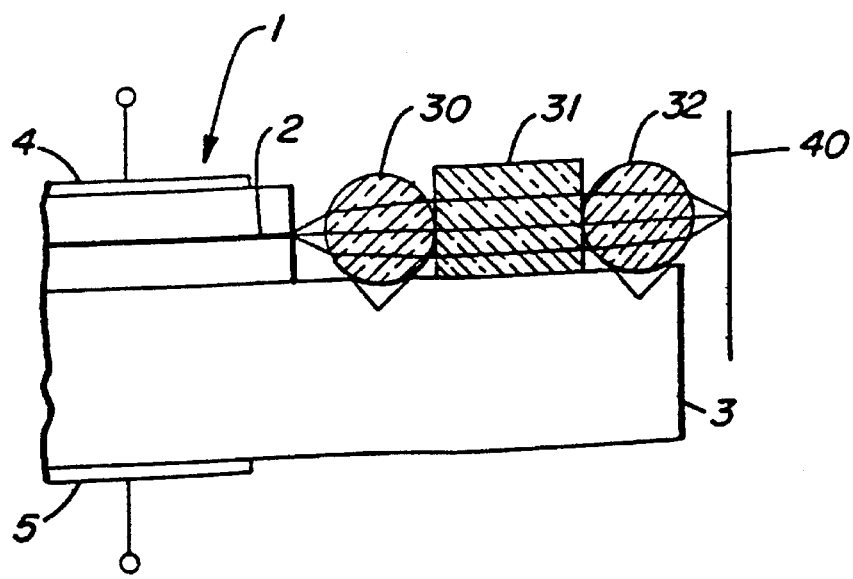
FIG. 34(a) is a cross-sectional view of the twentieth embodiment of the LED array.

FIG. 34(a) and (b) are respectively a cross-sectional view and a plane view of the twentieth embodiment of the LED head. The LED array head comprises an edge emitting type of LED element at least in a row, an active layer 2, a base plate 3 and electrodes 4, 5. These structures are the same as those in the above embodiments. The twentieth embodiment includes 1) a first long cylindrical lens 30 which has refractive power in a sub-scanning direction which is perpendicular to the LED array or a main scanning direction; 2) a flat cylindrical lens 31 which forms an array in a direction parallel to the LED array and has refractive power in the main scanning direction; and 3) a second long cylindrical lens 32 which has refractive power in the sub-scanning direction and is disposed in parallel to the first long cylindrical lens 30.

Figure 34B:
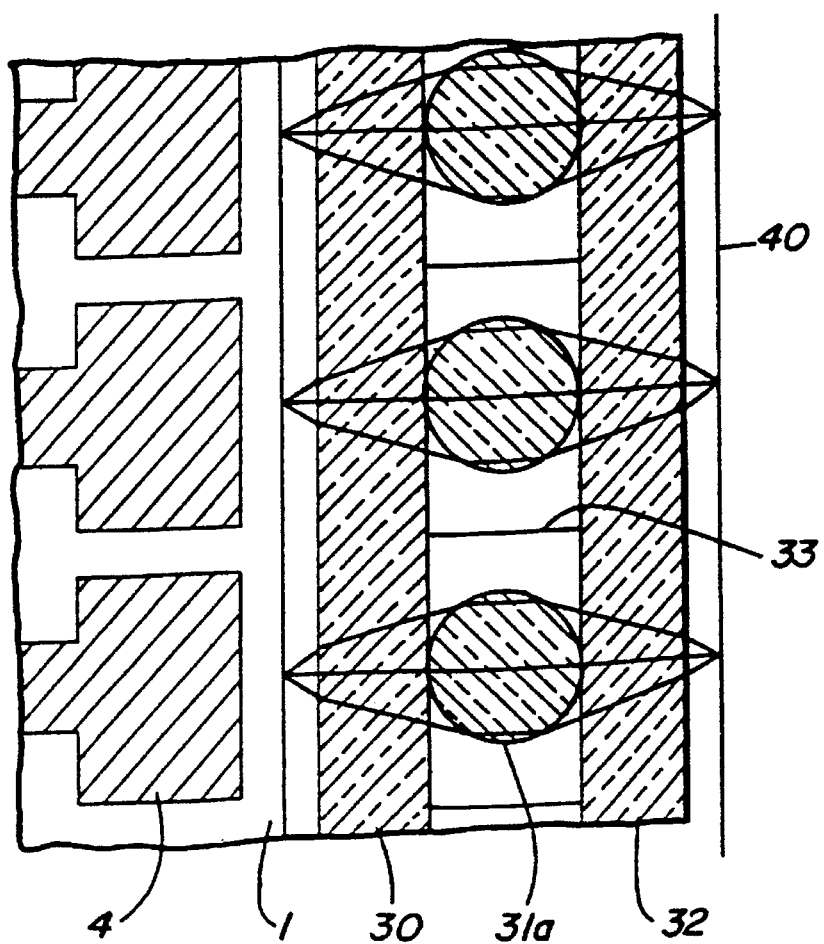
FIG. 34(b) is a plane view of the twentieth embodiment of the LED array.

In the prior art, as shown in FIG. 38, a luminous flux from an edge emitting type LED 1 creates an uneven emitting patter because a part of the luminous flux is reflected on the base plate near the light emitting end surface of the LED array 1. In contrast, since the LED head array of this embodiment as shown in FIG. 34 has the first cylindrical lens 30, which has refractive power in the sub-scanning direction, a luminous flux is converged in the sub-scanning direction by the first long cylindrical lens 30 and is made almost parallel to the base plate before reaching the base plate. The luminous flux is then fed into the flat cylindrical lens array 31. As shown in FIG. 34(b), in the flat cylindrical lens array 31, each flat cylindrical lens 31a corresponds to each LED element 4 in a one-to-one fashion. That is, a pitch of the flat cylindrical lens 31a is the same as that of the LED array. Each flat cylindrical lens 31a receives a corresponding luminous flux emitted from the active -layer 2. Although the received luminous flux is made substantially parallel in the sub-scanning direction by the first cylindrical lens 30, the luminous flux still remains diffused in the main scanning direction. The luminous flux is made substantially parallel in the main direction by the flat cylindrical lenses 31a. Since the flat cylindrical lens 31a has no refractive power in the sub-scanning direction, the luminous flux still remains in parallel in the sub-scanning direction after passing through the flat cylindrical lens 31a. That is, inside the flat cylindrical lens 31, the luminous flux is substantially parallel in the main as well as sub-scanning directions. Since the flat cylindrical lens 31a has refractive power in the main scanning direction, the luminous flux is converged in the main scanning direction. Since the flat cylindrical lens 31 has no refractive power in the sub-scanning direction, the luminous flux from the flat cylindrical lens in the sub-scanning direction is projected in parallel. The second long cylindrical lens 32 has refractive power in the sub-scanning direction and focuses the luminous flux that went through the flat cylindrical lens 31a on an image surface such as a photo-conductive3 drum etc. That is, the radius of curvatures of a first surface (an incident surface) and that of a second surface (an emitting surface) in the first long cylindrical lens 30 are assumed to be, respectively, that of r11 and r12. The radius of curvatures of a first surface and a second surface in the flat cylindrical lens 31 are also assumed to be, respectively, r21 and r22. In addition, the radius of curvatures of a first surface and that of a second surface in the second long cylindrical lens 32 are assumed to be, respectively, r31 and r32. Then, the following equations are generally held true: r11=−r12=r21 and −r22=r31=−r32.

In the LED array head as shown in FIG. 34, the luminous flux is not completely focused in the sub-scanning direction so that the focus magnification of the first cylindrical lens 30 does not need to be too high. That is, in the case of an LED, unlike coherent light used by a laser diode (an LD), since the focus magnification decides a diameter of a spot on an image surface, if the focus magnification is increased, the diameter of the spot also increases.

Figure 35:
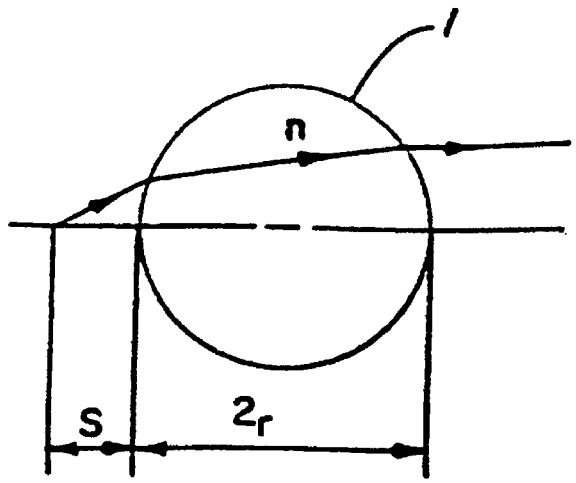
FIG. 35 is a schematic diagram illustrating an operational principle of a cylindrical lens corresponding to the first long cylindrical lens of the twentieth embodiment.

The operational principle of a cylindrical lens will be briefly described. As shown in FIG. 35, light diffuses in front of a cylindrical lens which has refractive index n and a diameter 2r. The radius of curvatures of a first surface and that of a second surface are both r. The light gets into the cylindrical lens, and then the luminous flux is projected in parallel by the cylindrical lens by providing a length S between the cylindrical surface and the emitting point in such a way that the following relation holds. $S=(-n+2)r/n(n-1)$. Therefore, the long cylindrical lens 30 is designed so that the length between an emitting portion of an. LED and the incident surface meets the above specified S.

Figure 36:
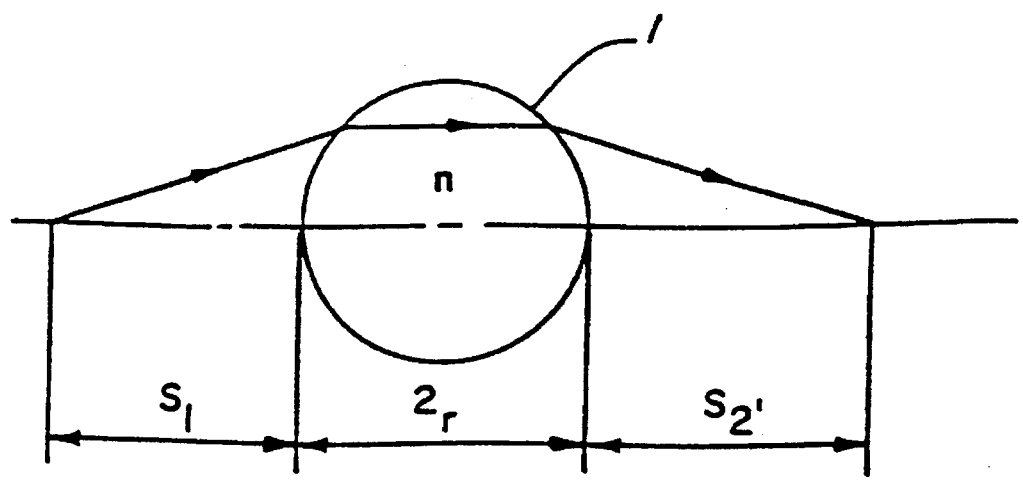
FIG. 36 is a schematic diagram illustrating an operational principle of a flat cylindrical lens of the twentieth embodiment.

As shown in FIG. 36, if a cylindrical lens 1 has a reflective index n and a diameter 2r with a radius of curvatures of r for a first surface and a second surface, a luminous flux focuses at $S1=r/(n-1)$ from the cylindrical lens 1 and a distance S2', is the same distance as S1. This is unit magnification. Accordingly, when the flat cylindrical lens 31a is designed so as to satisfy the relations as shown in FIG. 36, a unit magnification system is formed in the main scanning direction. When such a cylindrical lens 31a is used, since a luminous flux is parallel inside the cylindrical lens, a distance between an incident surface and an emitting surface can be varied without affecting optics. That is, as long as a radius of curvature of the first surface and that of the second surface are r, a cylindrical shape can be compressed or extended. In the above-mentioned equations, when reflective index n is 1.5, $S=0.66r$ and $S1=2r=S2'$.

Figure 37A:
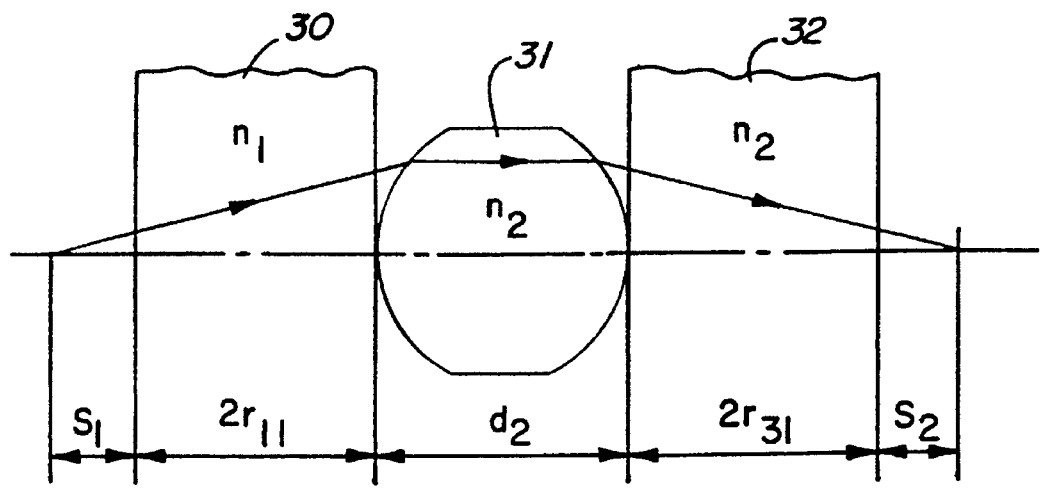
FIGS. 37(a) and (b) are examples in which principles as illustrated in FIGS. 35 and 36 are applied.
Figure 37B:
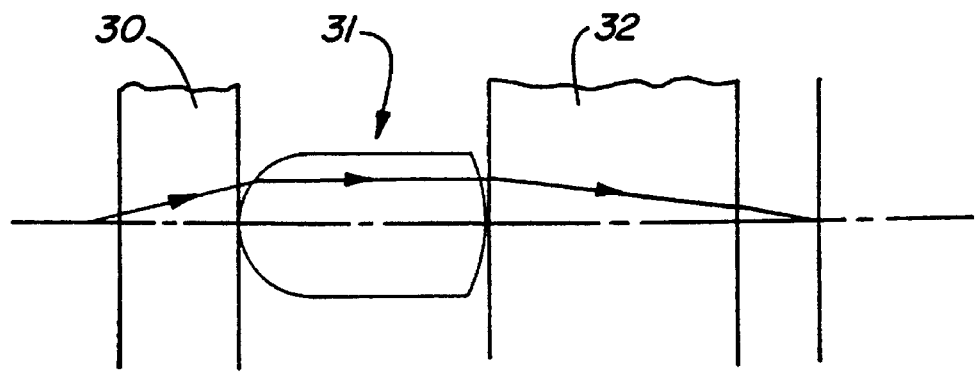

FIGS. 37(a) and (b) illustrate examples which embody the above-described relations of FIGS. 35 and 36. FIG. 37(a) is an example that satisfies a relation (r21=−r22). In this case, S1 is equal to S2' and a luminous flux is focused in unit magnification. FIG. 37(b) is an example that satisfies another relation (r12<−r22). In this case, the curvature diameter of the second lens is larger than that of the first lens, and a value of the focal magnification increases. However, since an interval between the end of the optical element and an image surface such as a photo-conductive3 drum is long, it facilitates a layout of an optical system. If a focal magnification is within twice or three times, an emitting portion is made smaller especially in a main scanning direction.

In the structure of the edge emitting type LED array head as shown in FIG. 34, since a diffusion angle in the main scanning direction is wide, the focusing function in the main scanning direction might deteriorate when the flat cylindrical lens 31 has only a cylindrical surface. Accordingly, the focus is improved by making at least one portion of the flat cylindrical lens surfaces spherical. A similar improvement is also obtained by a hyperboloid surface.

Further, in the structure of the LED array head as shown in FIG. 34, the first and second long cylindrical lenses are made of glass fiber. Glass fiber of a wide range of diameters from a few μm to more than 100 μm is easily obtainable. Since these glass fibers have a high precision, the cost benefit is slight.

In the structure of the LED array head shown in FIG. 34, a light shutting member 33 between an LED element and a photo-conductive3 member etc. prevents crosstalk between arrays. The example of FIG. 34(b) is one in which light shutting members 33 are provided between two adjacent flat cylindrical lenses 31a.

In FIG. 34, it is possible to form the cylindrical lenses 31a integral with the base plate 3 of the LED array. This construction enables a precise and mass producible productive optical element and to substantially prevent unevenness of light due to unfit parts.

The flat cylindrical lenses 31a can be separated into two pieces for a facilitated manufacturing process in which the first and second surface are formed differently as shown in FIG. 37(b)). If necessary, it is also possible to form lenses with different refractive indexes so that light shutting members are disposed at various positions.

As shown in FIG. 34(b), it is possible to integratedly form the light shutting member 33 when a flat cylindrical lens 31a is formed on a base plate of an LED array. This makes it possible to manufacture LED lens arrays productively and to reduce the number of processes of assembly.

tan (0/2)

(h: height of active layer, 1: length between the active layer and an end of a reflecting surface, 0:a diffusion angle)

Obviously, numerous modifications and variations of the present invention are possible in light of the above teachings. It is, therefore, to be understood that within the scope of the appended claims, the current invention may be practiced otherwise than as specifically described herein.

What is claimed is:

1. An LED array head comprising:

a base plate;

a plurality of edge emitting type LED elements disposed in two rows on said base plate, each of said LED elements having a plane of an active layer, said active layer emitting a luminous flux in a predetermined emitting direction; and a cylindrical optical element located adjacent to said LED elements and having a refractive power in a direction substantially perpendicular to said emitting direction for refracting said luminous flux before said luminous flux reaches said base plate, said cylindrical optical element having a central axis.

2. The LED array head according to claim 1, wherein said central axis of said cylindrical optical element is positioned off said plane of said active layer of the LED elements.

3. The LED array head according to claim, 1 said base plate includes a recess for partially accepting said cylindrical optical element so as to position said cylindrical optical element.

4. The LED array head according to claim 1, wherein said cylindrical optical element is made of fiberglass, said fiberglass having a central axis.

5. The LED array head according to claim 4, wherein said central axis of said fiberglass is positioned off said plane of said active layer of said LED array elements.

6. The LED array head according to claim 4, wherein said base plate includes a recess for partially accepting said fiberglass so as to position said fiberglass.

7. The LED array head comprising:

a base plate;

a plurality of edge emitting type LED elements positioned in a line on said base plate for each emitting a luminous flux, each of said edge emitting type LED elements having a plane of active layer for emitting said luminous flux in a predetermined emitting direction;

a lens array located adjacent to said LED elements for coupling said luminous flux from each of said LED elements so as to avoid said luminous flux to reflect on said base plate, said LED lens array having an optical axis.

8. The LED array head according to claim 7, wherein said optical axis of said lens array is positioned off said plane of said active layer.

9. The LED array head according to claim 7, wherein said base plate includes a recess for partially accepting said lens array so as to position said lens array.

10. The LED array head according to claim 7, wherein said lens array comprises said spherical lens.

11. The LED array head according to claim 10, wherein a center of said spherical lens is positioned off said plane of said active layer of said LED array elements.

12. The LED array head according to claim 10, said base plate includes a recess for partially accepting said spherical lens so as to position said LED array head.

13. The LED array head comprising:

a base plate;

a plurality of edge emitting type LED elements positioned in a row on said base plate for emitting a luminous flux in a predetermined emitting direction; and a prism located on said base plate adjacent to said LED elements for directing said luminous flux before said luminous flux reaches said base plate.

14. The LED array head according to claim 13, wherein said prism directs said luminous flux away from said base plate before said luminous flux reaches said base plate.

15. The LED array head according to claim 14, wherein said prism refracts said luminous flux from said LED elements in a direction substantially perpendicular to said emitting direction.

16. The LED array head according to claim 15, further comprising an anamorphic lens array having a spherical surface or toroidal surface which has a first predetermined curvature in a predetermined main direction and a second predetermined curvature in a predetermined sub-scanning direction.

17. The LED array head comprising:

a base plate;

a plurality of edge emitting type LED elements positioned in a row on said base plate for emitting a luminous flux in a predetermined emitting direction; and a parallel flat board glass located on said base plate adjacent to said LED elements and having a refractive power for refracting said luminous flux in a direction substantially perpendicular to said emitting direction.

18. The LED array head comprising:

a base plate;

a plurality of edge emitting type LED elements positioned in a row on said base plate for emitting a luminous flux, said luminous flux having a central axis;

a flat board micro-lens array located on said base plate adjacent to said LED elements and having portions, said micro-lens array having an object side surface, each portion having a refractive power for refracting said luminous flux in a predetermined direction, said refractive power becoming smaller as said portion is situated distal to an intersecting point between said central axis of said luminous flux and said object side surface of said flat micro-lens array.

19. The LED array head having a plurality of edge emitting type LED elements positioned in a predetermined main scanning direction on a base plate comprises:

a first long cylindrical lens which has a first refractive power in a predetermined sub-scanning direction perpendicular to said main scanning direction, a length of said plurality of said edge emitting type LED elements being longer than said first long cylindrical lens;

a plurality of flat cylindrical lens disposed in an array parallel to said LED elements and having a second refractive power in said main scanning direction; and a second long cylindrical lens disposed in parallel to said first long cylindrical lens having a third refractive power in the sub-scanning direction.

20. The LED array head according to claim 19, wherein when a first radius of curvature of a first incident surface and a second radius of curvature of a second emitting surface in said first long cylindrical lens are respectively predetermined and defined as r11 and r12, and a third radius of curvature of a first surface and a fourth radius of curvature of a second surface in said flat cylindrical lens being respectively defined as predetermined and r21 and r22, and further a fifth radius of curvature of a first surface and a sixth radius of curvature of a second surface in said second long cylindrical lens being respectively predetermined and defined as r31 and 32, the following relations being held true, r11=−r12=r21 and 31 rr=r31=−r32.

21. The LED array head according to claim 20, wherein r21=is equal to −r22.

22. The LED array head according to claim 20, wherein at least one of said flat cylindrical lens surfaces are spherical.

23. The LED array head according to claim 22, wherein said curvature is hyperboloid.

24. The LED array head according to claim 20, wherein r21 is equal to or smaller than r22.

25. The LED array head according to claim 19, wherein said first long cylindrical lens and said second long cylindrical lens are made of glass fiber.

26. The LED array head according to claim 19, further comprising a light shutting member located between an LED array and a photo-conductive3 member for substantially preventing crosstalk between said LED elements.

27. The LED array head according to claim 19, wherein said first cylindrical lens, said second cylindrical lens and said base plate of the LED array are integratedly formed.

28. The LED array head according to claim 27, wherein said flat cylindrical lens further comprises two pieces of lenses.

29. The LED array head according to claim 26, wherein said light shutting member is integratedly formed on said base plate of said LED array.

30. An LED array head comprising:

a base plate;

an edge-emitting LED element located on said base plate for emitting a luminous flux from an edge in an emitting direction; and a reflecting element located adjacent to said edge-emitting LED element for directing said luminous flux emitted from said edge-emitting LED element in a direction substantially perpendicular to said luminous flux emitting direction before said luminous flux reaches said base plate, said reflecting element having a spherical surface.

31. An LED array head comprising:

a base plate;

an edge-emitting LED element located on said base plate for emitting a luminous flux from an edge in an emitting direction; and a reflecting element located adjacent to said edge-emitting LED element for directing said luminous flux emitted from said edge-emitting LED element in a direction substantially perpendicular to said luminous flux emitting direction before said luminous flux reaches said base plate, said reflecting element having a cylindrical shape which has curvature in a predetermined main scanning direction.

32. An LED array head comprising:

a base plate;

an edge-emitting LED element located on said base plate for emitting a luminous flux from an edge in an emitting direction; and a reflecting element located adjacent to said edge-emitting LED element for directing said luminous flux emitted from said edge-emitting LED element in a direction substantially perpendicular to said luminous flux emitting direction before said luminous flux reaches said base, said reflecting element having a cylindrical shape which has curvature in a predetermined sub-scanning direction.

33. An LED array head comprising:

a base plate;

an edge-emitting LED element located on said base plate for emitting a luminous flux from an edge in an emitting direction; and a reflecting element located adjacent to said edge-emitting LED element for directing said luminous flux emitted from said edge-emitting LED element in a direction substantially perpendicular to said luminous flux emitting direction before said luminous flux reaches said base plate, said reflecting element having a spherical surface and a long cylindrical lens which has a predetermined refractive power in a predetermined sub-scanning direction.

34. An LED array head comprising:

a base plate;

an edge-emitting LED element located on said base plate for emitting a luminous flux from an edge in an emitting direction; and a reflecting element located adjacent to said edge-emitting LED element for directing said luminous flux emitted from said edge-emitting LED element in a direction substantially perpendicular to said luminous flux emitting direction before said luminous flux reaches said base plate, said reflecting element having a cylindrical shape which has curvature in a predetermined main scanning direction and a long cylindrical lens which has a predetermined refractive power in said main scanning direction.

35. An LED array head comprising:

a base plate;

an edge-emitting LED element located on said base plate for emitting a luminous flux from an edge in an emitting direction; and a reflecting element located adjacent to said edge-emitting LED element for directing said luminous flux emitted from said edge-emitting LED element in a direction substantially perpendicular to said luminous flux emitting direction before said luminous flux reaches said base plate, said reflecting element having a cylindrical shape which has a curvature in a predetermined sub-scanning direction and a cylindrical lens array which has a predetermined refractive power in a main scanning direction.

36. An LED array head comprising:

a base plate;

an edge-emitting LED element located on said base plate for emitting a luminous flux from an edge in an emitting direction; and a reflecting element located adjacent to said edge-emitting LED element for directing said luminous flux emitted from said edge-emitting LED element in a direction substantially perpendicular to said luminous flux emitting direction before said luminous flux reaches said base plate, said reflecting element having a cylindrical surface which comprises a paraboloid in a predetermined scanning direction.

37. An LED array head comprising:

a base plate;

an edge-emitting LED element located on said base plate for emitting a luminous flux from an edge in an emitting direction; and a reflecting element located adjacent to said edge-emitting LED element for directing said luminous flux emitted from said edge-emitting LED element in a direction substantially perpendicular to said luminous flux emitting direction before said luminous flux reaches said base plate, said reflecting element having a curved surface which comprises a partial paraboloid.

38. An LED array head comprising:

a base plate;

an edge-emitting LED element located on said base plate for emitting a luminous flux from an edge in an emitting direction; and a reflecting element located adjacent to said edge-emitting LED element for directing said luminous flux emitted from said edge-emitting LED element in a direction substantially perpendicular to said luminous flux emitting direction before said luminous flux reaches said base plate, said reflecting element having a cylindrical surface which comprises an ellipse in a predetermined sub-scanning direction.

39. An LED array head comprising:

a base plate;

a plurality of edge-emitting LED elements in at least two arrays and located on said base plate, said LED elements emitting said luminous flux in an opposed direction with each other, said opposed luminous flux being alternatively positioned between said two arrays, said reflecting element being disposed between said arrays; and a reflecting element located adjacent to said edge-emitting LED element for directing said luminous flux emitted from said edge-emitting LED elements in a direction substantially perpendicular to said luminous flux emitting direction before said luminous flux reaches said base plate said reflecting element having a spherical surface.

40. An LED array head comprising:

a base plate;

an edge-emitting LED element located on said base plate for emitting a luminous flux from an edge in an emitting direction; and a reflecting element made of substantially the same material as said emitting LED element and located adjacent to said edge-emitting LED element for directing said luminous flux emitted from said edge-emitting LED element in a direction substantially perpendicular to said luminous flux emitting direction before said luminous flux reaches said base plate said reflecting element having a spherical surface.

41. An LED array head comprising:

a base plate;

a plurality of edge-emitting LED elements in at least two arrays and located on said base plate, said LED elements emitting said luminous flux in an opposed direction with each other, said opposed luminous flux being alternatively positioned between said two arrays, said reflecting element being disposed between said arrays; and a plurality of reflecting elements located adjacent to said edge-emitting LED element for directing said luminous flux emitted from said edge-emitting LED elements in a direction substantially perpendicular to said luminous flux emitting direction before said luminous flux reaches said base plate, said reflecting elements having an area for reflecting said luminous flux, said area defining a reflecting point, said reflecting elements being alternatively arranged so that said reflecting points for said LED arrays shares a common axis.

* * * * *

UNITED STATES PATENT AND TRADEMARK OFFICE
CERTIFICATE OF CORRECTION

PATENT NO.  : 5,606,181
DATED       : February 25, 1997
INVENTOR(S) : Nobuo Sakuma, Seizo Suzuki, Hiromichi Atsuumi,
              Takeshi Ueda and Yasutaka Izumi It is certified that error appears in the above-indentified patent and that said Letters Patent is hereby corrected as shown below:

Column 9, line 14, change "hens" to --lens--.

Column 10, line 67, after "photo-conductive" delete "3".

Column 11, line 55, after "conductive" delete "3".

Column 12, line 45, after "photo-conductive" delete "3".

Column 12, line 66, after "photo-conductive" delete "3".

Column 15, line 21, after "and" delete "31" and insert -- - --.

Column 15, line 35, after "photo-conductive" delete "3".

Signed and Sealed this

Twenty-second Day of July, 1997

Attest:

Attesting Officer

BRUCE LEHMAN

Commissioner of Patents and Trademarks